(12) United States Patent
Hayashi et al.

(10) Patent No.: US 12,136,469 B2
(45) Date of Patent: Nov. 5, 2024

(54) SEMICONDUCTOR MEMORY DEVICE

(71) Applicant: KIOXIA CORPORATION, Tokyo (JP)

(72) Inventors: Shintaro Hayashi, Yokohama Kanagawa (JP); Mitsuhiro Abe, Kawasaki Kanagawa (JP); Naoaki Kanagawa, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 49 days.

(21) Appl. No.: 17/896,907

(22) Filed: Aug. 26, 2022

(65) Prior Publication Data

US 2023/0298641 A1  Sep. 21, 2023

(30) Foreign Application Priority Data

Mar. 18, 2022  (JP) .................. 2022-043340

(51) Int. Cl.
*G11C 7/10* (2006.01)
*G11C 7/22* (2006.01)
*G11C 16/32* (2006.01)
*G11C 16/04* (2006.01)
*G11C 16/26* (2006.01)

(52) U.S. Cl.
CPC .......... *G11C 7/1063* (2013.01); *G11C 7/1066* (2013.01); *G11C 7/1069* (2013.01); *G11C 7/1096* (2013.01); *G11C 7/222* (2013.01); *G11C 16/32* (2013.01); *G11C 16/0483* (2013.01);
(Continued)

(58) Field of Classification Search
CPC ... G11C 7/1063; G11C 7/1069; G11C 7/1096; G11C 7/222; G11C 16/0483; G11C 2207/2272; G11C 7/1039; G11C 7/106; G11C 7/1066; G11C 11/5642; G11C 16/08; G11C 16/26; G11C 16/32; G11C 7/22; G06F 12/0246
See application file for complete search history.

(56) References Cited

U.S. PATENT DOCUMENTS

| | | |
|---|---|---|
| 6,928,494 B1 | 8/2005 | Volk et al. |
| 2003/0070052 A1 | 4/2003 | Lai |

(Continued)

FOREIGN PATENT DOCUMENTS

| | | |
|---|---|---|
| TW | 563019 B | 11/2003 |
| TW | 563132 B | 11/2003 |

(Continued)

*Primary Examiner* — Jay W. Radke
(74) *Attorney, Agent, or Firm* — Kim & Stewart LLP

(57) ABSTRACT

A semiconductor memory device includes a memory cell array, a storing unit that stores data read out from the memory cell array in storage circuits, an output circuit, and a control circuit. In response to a read request, the control circuit adjusts the value of a read pointer of the storing unit, controls the storing unit to sequentially output to the output circuit first and second data stored in first and second storage circuits of the storing unit, respectively, the read pointer having a first value that references the first storage circuit when the first data is output, and a second value that references the second storage circuit when the second data is output, and controls the output circuit to transmit the first and second data to the memory controller as dummy data, and thereafter to transmit at least third data to the memory controller as read data.

15 Claims, 22 Drawing Sheets

(52) U.S. Cl.
CPC ...... *G11C 16/26* (2013.01); *G11C 2207/2272* (2013.01)

(56) References Cited

U.S. PATENT DOCUMENTS

| | | |
|---|---|---|
| 2011/0019489 A1 | 1/2011 | Huang et al. |
| 2013/0036336 A1* | 2/2013 | Kitamura ............ H04L 12/4666 |
| | | 714/E11.178 |
| 2021/0295929 A1 | 9/2021 | Iijima |
| 2021/0383848 A1 | 12/2021 | Jeong et al. |
| 2022/0137870 A1* | 5/2022 | Yamamoto ............ G11C 7/1063 |
| | | 711/154 |

FOREIGN PATENT DOCUMENTS

| | | |
|---|---|---|
| TW | 201104682 A | 2/2011 |
| TW | 202137015 A | 10/2021 |
| WO | 2021049033 A1 | 3/2021 |

\* cited by examiner

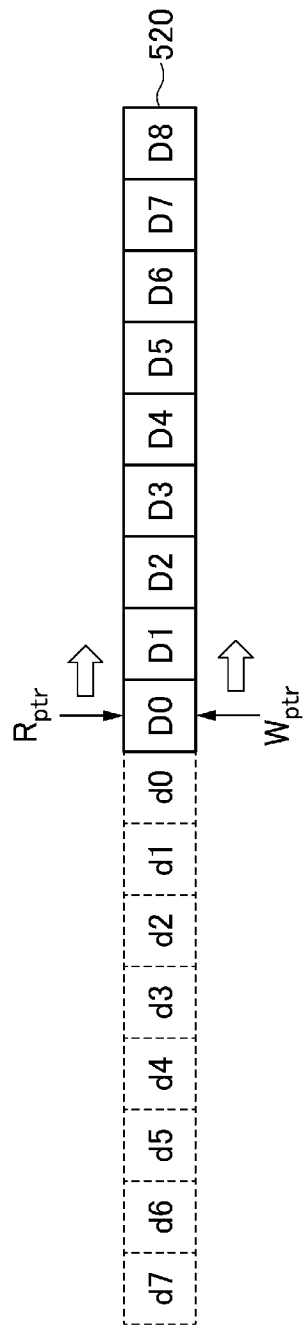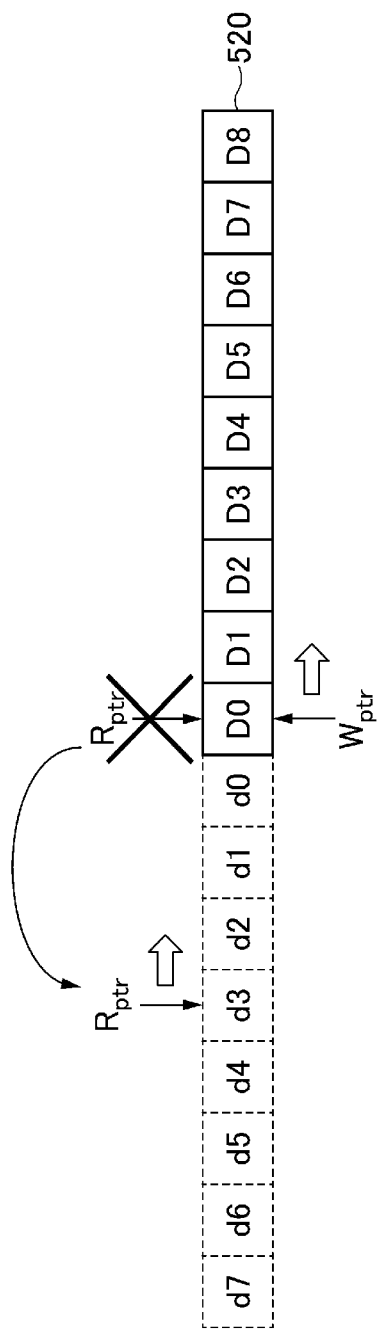

SEMICONDUCTOR MEMORY DEVICE

CROSS-REFERENCE TO RELATED APPLICATION(S)

This application is based upon and claims the benefit of priority from Japanese Patent Application No. 2022-043340, filed Mar. 18, 2022, the entire contents of which are incorporated herein by reference.

FIELD

Embodiments described herein relate generally to a semiconductor memory device.

BACKGROUND

A semiconductor memory device such as a NAND type flash memory outputs read data in response to a signal transmitted from a memory controller.

DESCRIPTION OF THE DRAWINGS

FIGS. 15A and 15B are diagrams illustrating the adjustment of a read pointer.

DETAILED DESCRIPTION

Figure 1:
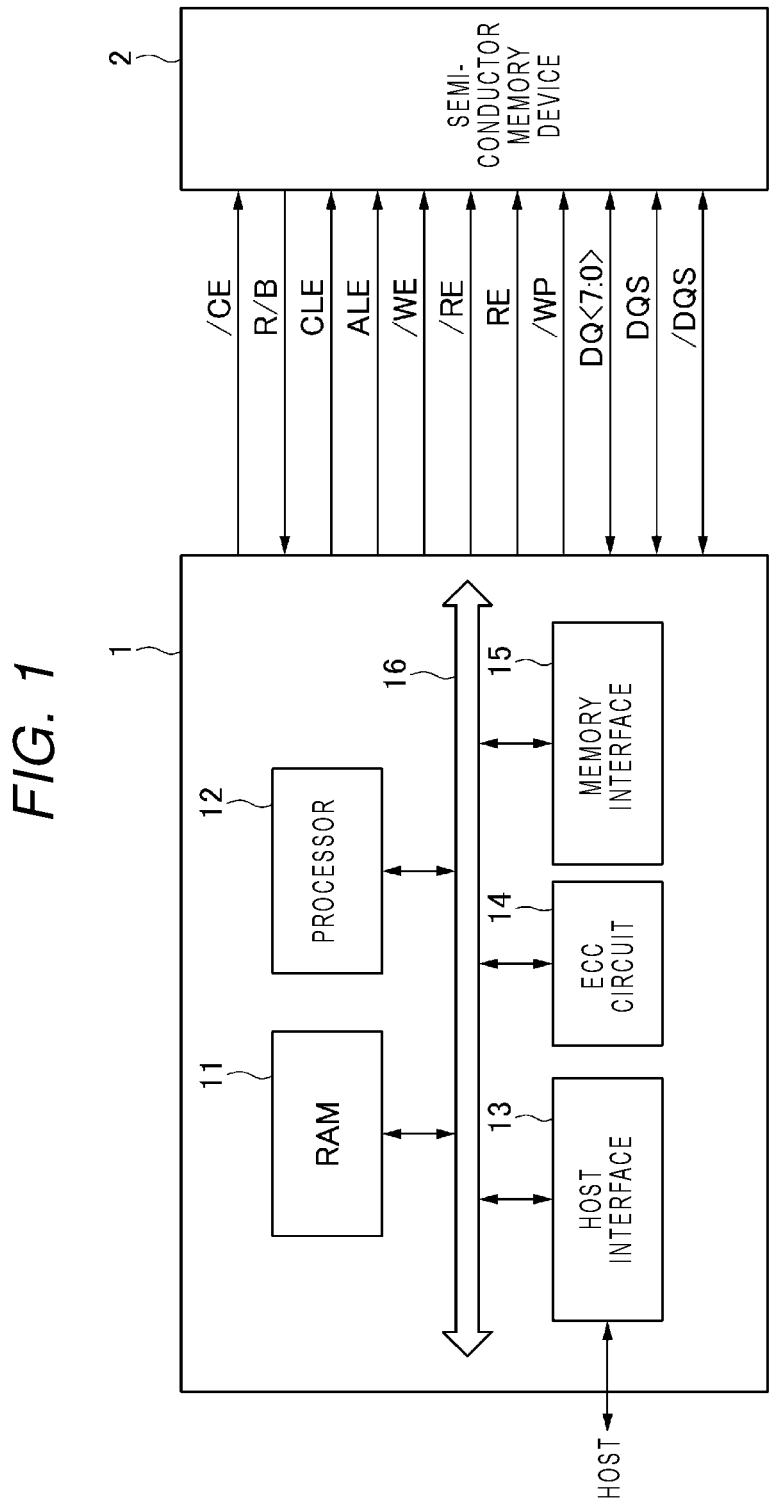
FIGS. 1 and 2 are block diagrams illustrating different configuration examples of a memory system according to an embodiment.

Embodiments provide a semiconductor memory device capable of stably outputting read data.

In general, according to one embodiment, a semiconductor memory device includes a memory cell array, a storing unit configured to temporarily store a plurality of data read out from the memory cell array in a plurality of storage circuits, an output circuit configured to output the data transmitted from the storing unit to an external memory controller, and a control circuit configured to control the storing unit to output data to the output circuit in response to a read signal received from the memory controller and in accordance with a value of a read pointer of the storing unit. In response to a request for normal data requested by the memory controller, the control circuit adjusts the value of the read pointer, controls the storing unit to sequentially output to the output circuit at least first and second data stored in first and second storage circuits of the storing unit, respectively, in response to read signals received from the memory controller, the read pointer having a first value that references the first storage circuit when the first data is output, and a second value that references the second storage circuit when the second data is output, and controls the output circuit to transmit the first data and the second data to the memory controller as non-normal data, and thereafter to transmit at least third data, which is read out from the memory cell array, to the memory controller as the normal data.

Hereinafter, the present embodiment will be described with reference to the accompanying drawings. In order to facilitate the understanding of descriptions, the same reference numerals will be given to the same components as much as possible in each drawing, and duplicate descriptions thereof will be omitted.

A semiconductor memory device 2 according to the present embodiment is a nonvolatile memory device configured as a NAND-type flash memory. In FIG. 1, a configuration example of a memory system including the semiconductor memory device 2 is illustrated as a block diagram. This memory system includes a memory controller 1 and the semiconductor memory device 2.

Figure 2:
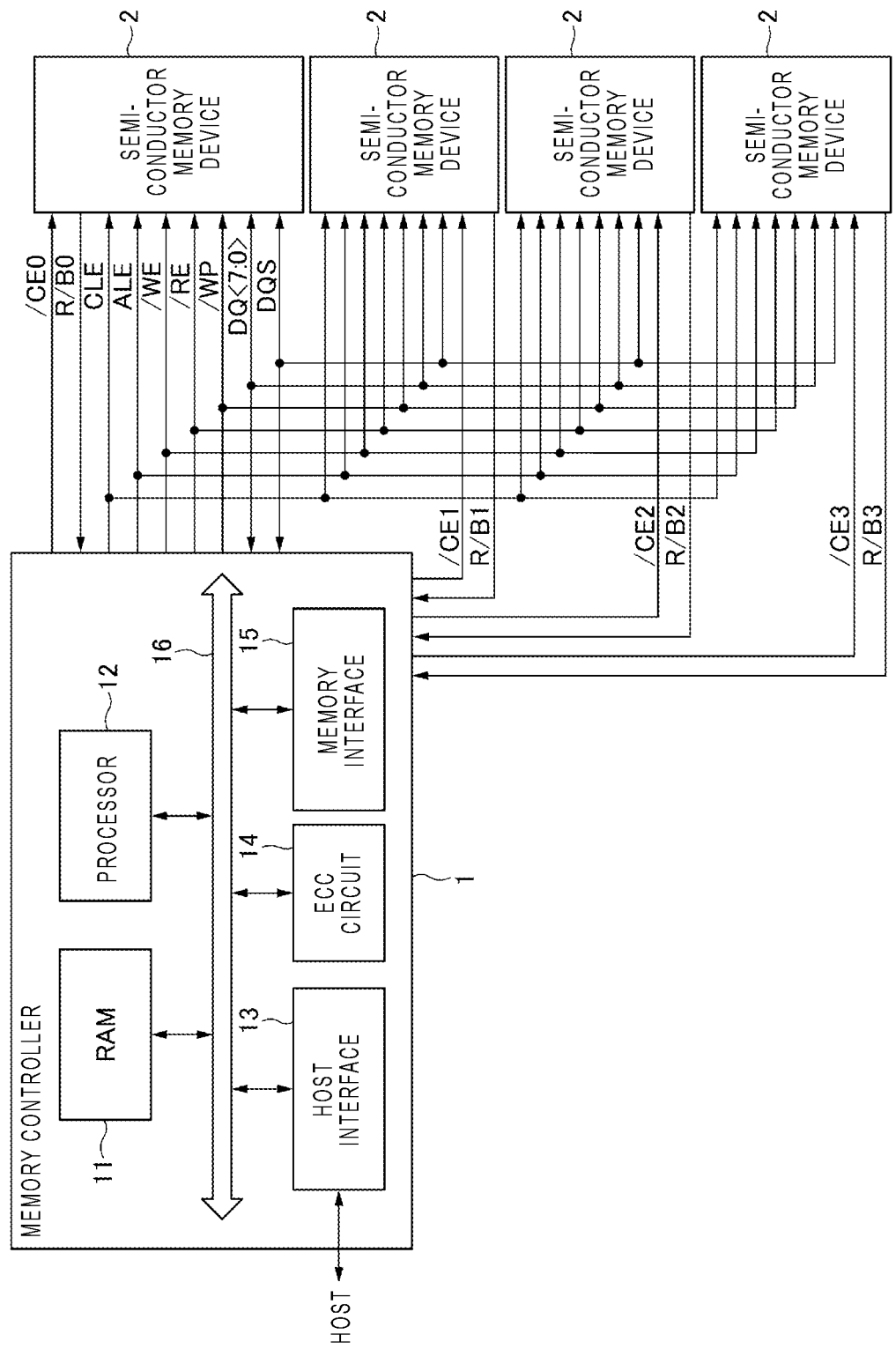

In an actual memory system, as illustrated in FIG. 2, a plurality of semiconductor memory devices 2 are provided for one memory controller 1. In FIG. 1, only one of the semiconductor memory devices 2 is illustrated. A specific configuration of the semiconductor memory device 2 will be described later.

This memory system is connectable to a host (not illustrated). The host is, for example, an electronic device such as a personal computer or a portable terminal. The memory controller 1 controls the write of data to the semiconductor memory device 2 in response to a write request from the host. Further, the memory controller 1 controls the read of data from the semiconductor memory device 2 in response to a read request from the host.

Between the memory controller 1 and the semiconductor memory device 2, respective signals such as a chip enable signal /CE, ready busy signal R/B, command latch enable signal CLE, address latch enable signal ALE, write enable signal /WE, read enable signals /RE and RE, write protect signal /WP, data signal DQ<7:0>, and data strobe signals DQS and /DQS are transmitted and received.

The chip enable signal /CE is a signal for enabling the semiconductor memory device 2. The ready busy signal R/B is a signal for indicating whether the semiconductor memory device 2 is in a ready state or in a busy state. The "ready state" is a state where an external command is receivable. The "busy state" is a state where an external command is not receivable.

As illustrated in FIG. 2, the chip enable signal /CE is individually transmitted to each of the plurality of semiconductor memory devices 2. In FIG. 2, respective chip enable signals /CE are numbered at the end, such as, for example, "/CE0", so as to distinguish them from each other.

Similarly, the ready busy signal R/B is individually transmitted from each of the plurality of semiconductor memory devices 2. In FIG. 2, respective ready busy signals R/B are numbered at the end, such as, for example, "R/B0", so as to distinguish them from each other.

For the signals (such as the command latch enable signal CLE) other than the chip enable signal /CE and the ready busy signal R/B, they are transmitted and received between the memory controller 1 and the semiconductor memory device 2 via a signal line common to the plurality of semiconductor memory devices 2. The memory controller 1 specifies the semiconductor memory device 2 which is a communication target by using the individual chip enable signal /CE.

The command latch enable signal CLE is a signal indicating that the data signal DQ<7:0> contains a command. The address latch enable signal ALE is a signal indicating that the data signal DQ<7:0> contains an address. The write enable signal /WE is a signal for indicating to the semiconductor memory device 2 that the data signal DQ<7:0> should be received therein, and is asserted at a "Low(L)" level whenever a command, address, and data are transmitted by the memory controller 1 to the semiconductor memory device 2 through the data signal DQ<7:0>.

The read enable signal /RE is a signal indicating to the semiconductor memory device 2 that it should output the data signal DQ<7:0> therefrom. The signal RE is a complementary signal of the signal /RE. These are used, for example, to control the operation timing of the semiconductor memory device 2 when outputting the data signal DQ<7:0>. The write protect signal /WP is a signal for instructing the semiconductor memory device 2 to prohibit data write and erase. The data signal DQ<7:0> is transmitted and received between the semiconductor memory device 2 and the memory controller 1, and contains a command, address, and data. The data strobe signal DQS is a signal for controlling the timings of inputting and outputting the data signal DQ<7:0>. The signal /DQS is a complementary signal of the signal DQS.

The memory controller 1 includes a RAM 11, a processor 12, a host interface 13, an ECC circuit 14, and a memory interface 15. The RAM 11, the processor 12, the host interface 13, the ECC circuit 14, and the memory interface 15 are connected to each other by an internal bus 16.

The host interface 13 outputs a request received from the host and user data (e.g., write data) to the internal bus 16. Further, the host interface 13 transmits the user data read out from the semiconductor memory device 2 (e.g., read data) and a response from the processor 12 to the host.

The memory interface 15 controls a processing of writing the user data to the semiconductor memory device 2 and a processing of reading out the user data from the semiconductor memory device 2 based on an instruction of the processor 12.

The processor 12 controls the memory controller 1. The processor 12 is, for example, a CPU or an MPU. When the processor 12 receives a request from the host via the host interface 13, the processor 12 performs control in response to the request. For example, the processor 12 instructs the memory interface 15 to write the user data and parity to the semiconductor memory device 2 in response to a request from the host. Further, the processor 12 instructs the memory interface 15 to read the user data and parity from the semiconductor memory device 2 in response to a request from the host.

The processor 12 determines a storage area (also referred to herein as a memory area) in the semiconductor memory device 2 for the user data stored in the RAM 11. The user data is stored in the RAM 11 via the internal bus 16. The processor 12 determines the memory area for data in units of writing the data, which is referred to herein as a page. The user data stored in one page of the semiconductor memory device 2 is hereinafter also referred to as "unit data" (or "page data"). The unit data is generally encoded and stored in the semiconductor memory device 2 as a codeword. In the present embodiment, encoding is optional so it may be omitted. The memory controller 1 may store the unit data in the semiconductor memory device 2 without encoding, but FIG. 1 illustrates a configuration in which the memory controller 1 performs encoding as one configuration example. When the memory controller 1 does not perform encoding, the page data matches the unit data. Further, one codeword may be generated based on one unit data, or one codeword may be generated based on divided data obtained by dividing the unit data. Further, one codeword may be generated using a plurality of unit data.

The processor 12 determines the memory area of the semiconductor memory device 2 to which each unit data is to be written. A physical address is allocated to the memory area of the semiconductor memory device 2. The processor 12 manages the memory area to which the unit data is to be written by using the physical address. The processor 12 designates the determined memory area (by specifying the physical address) and instructs the memory interface 15 to write the user data to the semiconductor memory device 2. The processor 12 manages a correspondence between a physical address and a logical address (e.g., a logical address managed by the host) of the user data. When the processor 12 receives a read request including a logical address from the host, the processor 12 determines a physical address corresponding to the logical address, and designates the physical address and instructs the memory interface 15 to read the user data.

The ECC circuit 14 encodes the user data stored in the RAM 11 to generate a codeword. Further, the ECC circuit 14 decodes a codeword read out from the semiconductor memory device 2. For example, the ECC circuit 14 performs the detection of an error in data and the correction of that error by using a checksum given to the user data.

The RAM 11 temporarily stores the user data received from the host until the user data is stored in the semiconductor memory device 2, or temporarily stores the data read out from the semiconductor memory device 2 until the data is transmitted to the host. The RAM 11 is, for example, a general-purpose memory such as an SRAM or DRAM.

FIG. 1 illustrates a configuration example in which the memory controller 1 includes the ECC circuit 14 and the memory interface 15 respectively. However, the ECC circuit 14 may be built in the memory interface 15. Further, the ECC circuit 14 may be built in the semiconductor memory device 2. A specific configuration or arrangement of each element illustrated in FIG. 1 is not particularly limited to that which is depicted.

When a write request is received from the host, the memory system of FIG. 1 operates as follows. The processor 12 temporarily stores, in the RAM 11, data which is a target of a write operation. The processor 12 reads out the data stored in the RAM 11 and inputs the data to the ECC circuit 14. The ECC circuit 14 encodes the input data, and inputs a codeword to the memory interface 15. The memory interface 15 transmits the input codeword to the semiconductor memory device 2 for writing therein.

When a read request is received from the host, the memory system of FIG. 1 operates as follows. The memory interface 15 inputs a codeword read out from the semiconductor memory device 2 to the ECC circuit 14. The ECC circuit 14 decodes the input codeword and stores the decoded data in the RAM 11. The processor 12 transmits the data stored in the RAM 11 to the host via the host interface 13.

Figure 3:
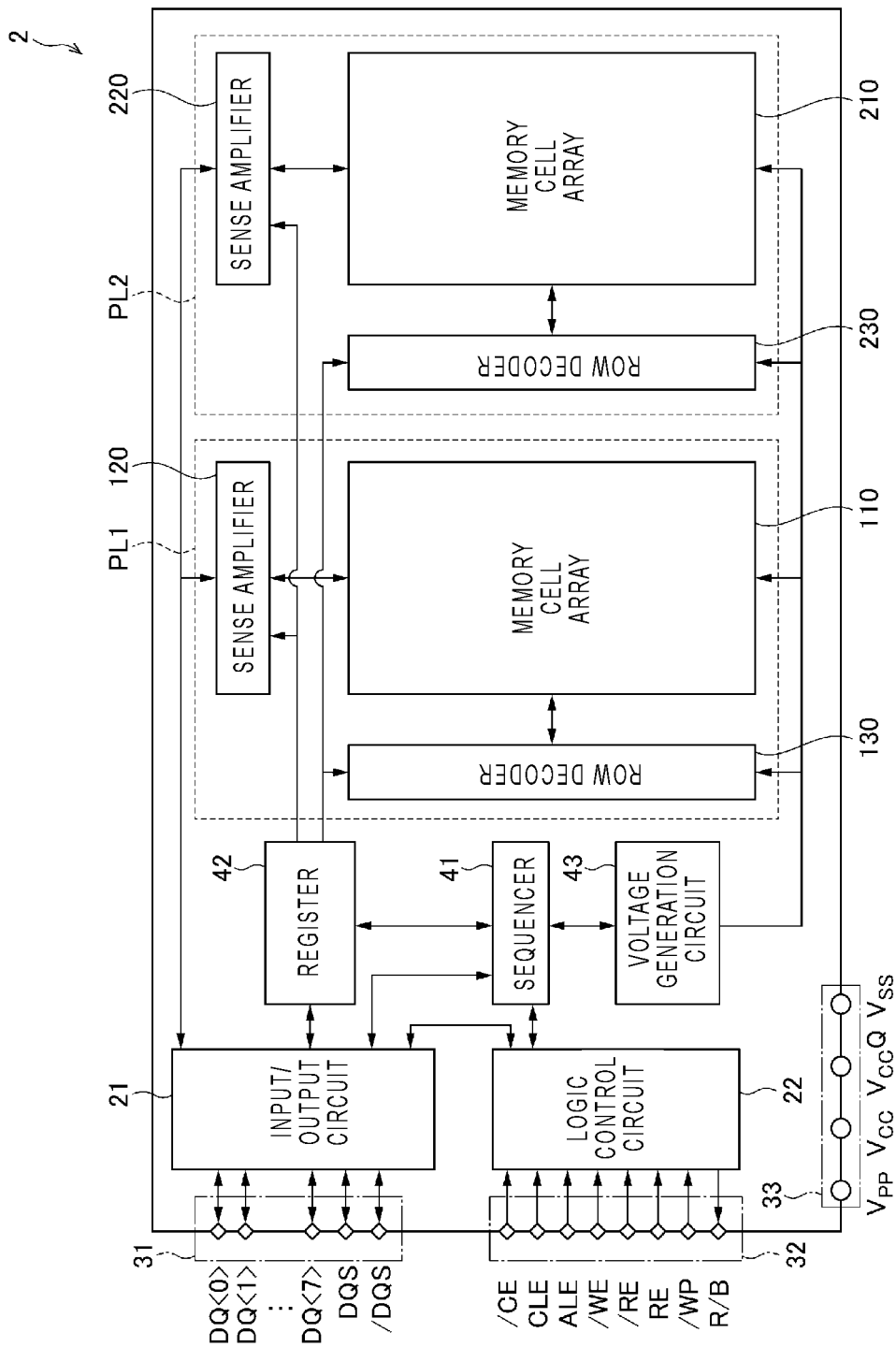
FIG. 3 is a block diagram illustrating a configuration of a semiconductor memory device according to an embodiment.

A configuration of the semiconductor memory device 2 will be described. As illustrated in FIG. 3, the semiconductor memory device 2 includes two planes PL1 and PL2, an input/output circuit 21, a logic control circuit 22, a sequencer 41, a register 42, a voltage generation circuit 43, an input/output pad group 31, a logic control pad group 32, and a power input terminal group 33.

The plane PL1 includes a memory cell array 110, a sense amplifier 120, and a row decoder 130. Further, the plane PL2 includes a memory cell array 210, a sense amplifier 220, and a row decoder 230. A configuration of the plane PL1 and a configuration of the plane PL2 are the same as each other. The configurations of the memory cell array 110 and the memory cell array 210 are the same. Similarly, the configurations of the sense amplifier 120 and the sense amplifier 220 are the same, and the configurations of the row decoder 130 and the row decoder 230 are the same. The number of planes provided in the semiconductor memory device 2 may be two as in the present embodiment, but may be one, or three or more.

The memory cell array 110 and the memory cell array 210 are parts that store data. Each of the memory cell array 110 and the memory cell array 210 includes a plurality of memory cell transistors associated with word lines and bit lines. Such a specific configuration will be described later.

The input/output circuit 21 transmits and receives the data signal DQ<7:0> and the data strobe signals DQS and/DQS to and from the memory controller 1. The input/output circuit 21 transfers a command and an address in the data signal DQ<7:0> to the register 42. Further, the input/output circuit 21 transmits and receives write data and read data to and from the sense amplifier 120 and the sense amplifier 220. The input/output circuit 21 has both a function as an "input circuit" of receiving a command from the memory controller 1 and a function as an "output circuit" of outputting data to the memory controller 1. In other embodiments, the input circuit and the output circuit may be configured as separate circuits.

The logic control circuit 22 receives, from the memory controller 1, the chip enable signal /CE, the command latch enable signal CLE, the address latch enable signal ALE, the write enable signal /WE, the read enable signals RE and /RE, and the write protect signal /WP. Further, the logic control circuit 22 transfers the ready busy signal R/B to the memory controller 1 to notify the status of the semiconductor memory device 2 to the outside.

Both the input/output circuit 21 and the logic control circuit 22 are circuits configured as parts for the input and output of signals from and to the memory controller 1. That is, the input/output circuit 21 and the logic control circuit 22 are provided as an interface circuit of the semiconductor memory device 2.

The sequencer 41 is a circuit that controls an operation of each unit such as the planes PL1 and PL2 or the voltage generation circuit 43 based on a control signal input from the memory controller 1 to the semiconductor memory device 2. The sequencer 41 is a circuit that controls an operation of the memory cell arrays 110 and 210, and corresponds to a "control unit" of the semiconductor memory device 2. Both the sequencer 41 and the logic control circuit 22 may be referred to as the above-mentioned "control unit".

The register 42 is a circuit that temporarily stores a command or an address. The register 42 is also a circuit that stores status information indicating each status of the planes PL1 and PL2. The status information is output from the input/output circuit 21 to the memory controller 1 as a status signal in response to a request from the memory controller 1.

The voltage generation circuit 43 is a circuit that generates a voltage required for each of a data write operation, read operation, and erase operation in the memory cell arrays 110 and 210 based on an instruction from the sequencer 41. Such a voltage includes, for example, a voltage such as VPGM, VPASS_PGM, or VPASS_READ applied to a word line WL to be described later, or a voltage applied to a bit line BL to be described later. The voltage generation circuit 43 is able to individually apply a voltage to each of the word line WL and the bit line BL so that the plane PL1 and the plane PL2 may operate in parallel to each other.

The input/output pad group 31 is a part provided with a plurality of terminals (pads) for transmitting and receiving each signal between the memory controller 1 and the input/output circuit 21. Each terminal is provided individually to correspond to each of the signal DQ<7:0> and the data strobe signals DQS and /DQS.

The logic control pad group 32 is a part provided with a plurality of terminals (pads) for transmitting and receiving each signal between the memory controller 1 and the logic control circuit 22. Each terminal is provided individually to correspond to each of the chip enable signal /CE, the command latch enable signal CLE, the address latch enable signal ALE, the write enable signal /WE, the read enable signals RE and /RE, the write protect signal /WP, and the ready busy signal R/B.

The power input terminal group 33 is a part provided with a plurality of terminals for receiving each applied voltage required for an operation of the semiconductor memory device 2. The voltage applied to each terminal includes power supply voltages Vcc, VccQ, and Vpp, and a ground voltage Vss.

The power supply voltage Vcc is a circuit power supply voltage applied from the outside as an operation power supply, and is, for example, a voltage of about 3.3 V. The power supply voltage VccQ is, for example, a voltage of 1.2

V. The power supply voltage VccQ is a voltage used when transmitting and receiving a signal between the memory controller 1 and the semiconductor memory device 2. The power supply voltage Vpp is a power supply voltage higher than the power supply voltage Vcc, and is, for example, a voltage of 12 V.

When writing data to or erasing data from the memory cell arrays 110 and 210, a high voltage VPGM of about 20 V is required. At this time, a desired voltage may be generated at a high speed with low power consumption when boosting the power supply voltage Vpp of about 12 V, rather than boosting the power supply voltage Vcc of about 3.3 V by a boosting circuit of the voltage generation circuit 43. Meanwhile, for example, when the semiconductor memory device 2 is used under an environment in which a high voltage cannot be supplied, the power supply voltage Vpp may not be supplied. Even when the power supply voltage Vpp is not supplied, the semiconductor memory device 2 may execute a variety of operations as long as the power supply voltage Vcc is supplied. That is, the power supply voltage Vcc is a power supply that is normally supplied to the semiconductor memory device 2, and the power supply voltage Vpp is, for example, a power supply that is additionally and optionally supplied according to the usage environment.

A configuration of the planes PL1 and PL2 will be described. Meanwhile, as described above, a configuration of the plane PL1 and a configuration of the plane PL2 are the same as each other. Therefore, in the following, only a configuration of the plane PL1 will be described, and the illustration and description of a configuration of the plane PL2 will be omitted.

Figure 4:
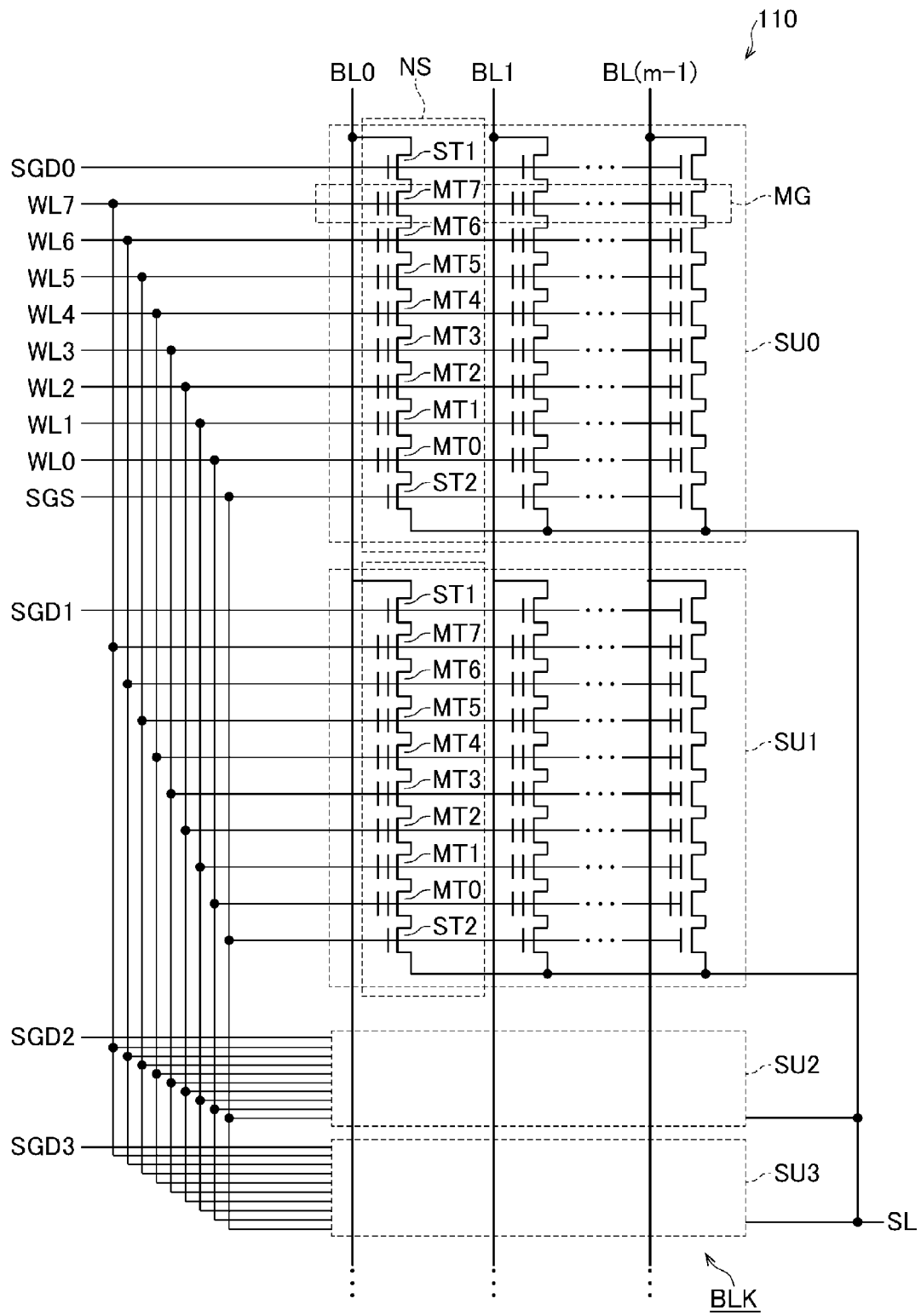
FIG. 4 is an equivalent circuit diagram illustrating a configuration of a memory cell array.

FIG. 4 illustrates a configuration of the memory cell array 110 provided in the plane PL1 as an equivalent circuit diagram. Although the memory cell array 110 is configured with a plurality of blocks BLK, only one of these blocks BLK is illustrated in FIG. 4. A configuration of another block BLK provided in the memory cell array 110 is also the same as that illustrated in FIG. 4.

As illustrated in FIG. 4, the block BLK includes, for example, four string units SU (SU0 to SU3). Further, each string unit SU includes a plurality of NAND strings NS. Each of the NAND strings NS includes, for example, eight memory cell transistors MT (MT0 to MT7) and select transistors ST1 and ST2.

The number of memory cell transistors MT is not limited to 8, and may be, for example, 32, 48, 64, or 96. In addition, in order to improve the cut-off characteristics, each of the select transistors ST1 and ST2 may be configured with a plurality of transistors instead of a single transistor. Furthermore, a dummy cell transistor may be provided between the memory cell transistors MT and the select transistors ST1 and ST2.

The memory cell transistors MT are connected in series between the select transistor ST1 and the select transistor ST2. The memory cell transistor MT7 at one end side is connected to the source of the select transistor ST1, and the memory cell transistor MT0 at the other end side is connected to the drain of the select transistor ST2.

The gates of the respective select transistors ST1 of the string units SU0 to SU3 are connected in common to select gate lines SGD0 to SGD3, respectively. The gate of the select transistor ST2 is connected in common to the same select gate line SGS across a plurality of string units SU in the same block BLK. The gates of the memory cell transistors MT0 to MT7 in the same block BLK are connected in common to word lines WL0 to WL7, respectively. That is, the word lines WL0 to WL7 and the select gate line SGS are common among the plurality of string units SU0 to SU3 in the same block BLK, whereas the select gate line SGD is provided individually for each of the string units SU0 to SU3 even in the same block BLK.

The memory cell array 110 is provided with m bit lines BL (BL0, BL1, . . . , BL(m−1)). The above "m" is an integer representing the number of NAND strings NS provided in one string unit SU. In each NAND string NS, the drain of the select transistor ST1 is connected to a corresponding bit line BL. The source of the select transistor ST2 is connected to a source line SL. The source line SL is connected in common to the sources of a plurality of select transistors ST2 provided in the block BLK.

The data stored in a plurality of memory cell transistors MT in the same block BLK are collectively erased. Meanwhile, the read and write of data are performed collectively for a plurality of memory cell transistors MT which are connected to one word line WL and belong to one string unit SU. Each memory cell may store data of 3 bits including a high-order bit, a middle-order bit, and a low-order bit.

That is, the semiconductor memory device 2 according to the present embodiment adopts, as a method of writing data to the memory cell transistor MT, a TLC method of storing 3-bit data in one memory cell transistor MT. Instead, an MLC method of storing 2-bit data in one memory cell transistor MT may be adopted as the method of writing data to the memory cell transistor MT. The number of bits of data stored in one memory cell transistor MT, however, is not limited to 2 or 3.

In the following description, a set of 1-bit data stored in the plurality of memory cell transistors MT which are connected to one word line WL and belong to one string unit SU is referred to as a "page". In FIG. 4, the reference character "MT" is given to one set of memory cell transistors MT described above.

When 3-bit data is stored in one memory cell transistor MT as in the present embodiment, a set of the memory cell transistors MT connected to the common word line WL in one string unit SU may store 3 pages of data. Among them, a page including a set of low-order bit data is hereinafter also referred to as a "low-order page", and the data of the low-order page is hereinafter also referred to as "low-order page data". Similarly, a page including a set of middle-order bit data is hereinafter also referred to as a "middle-order page", and the data of the middle-order page is hereinafter also referred to as "middle-order page data". A page including a set of high-order bit data is hereinafter also referred to as a "high-order page", and the data of the high-order page is hereinafter also referred to as "high-order page data".

Figure 5:
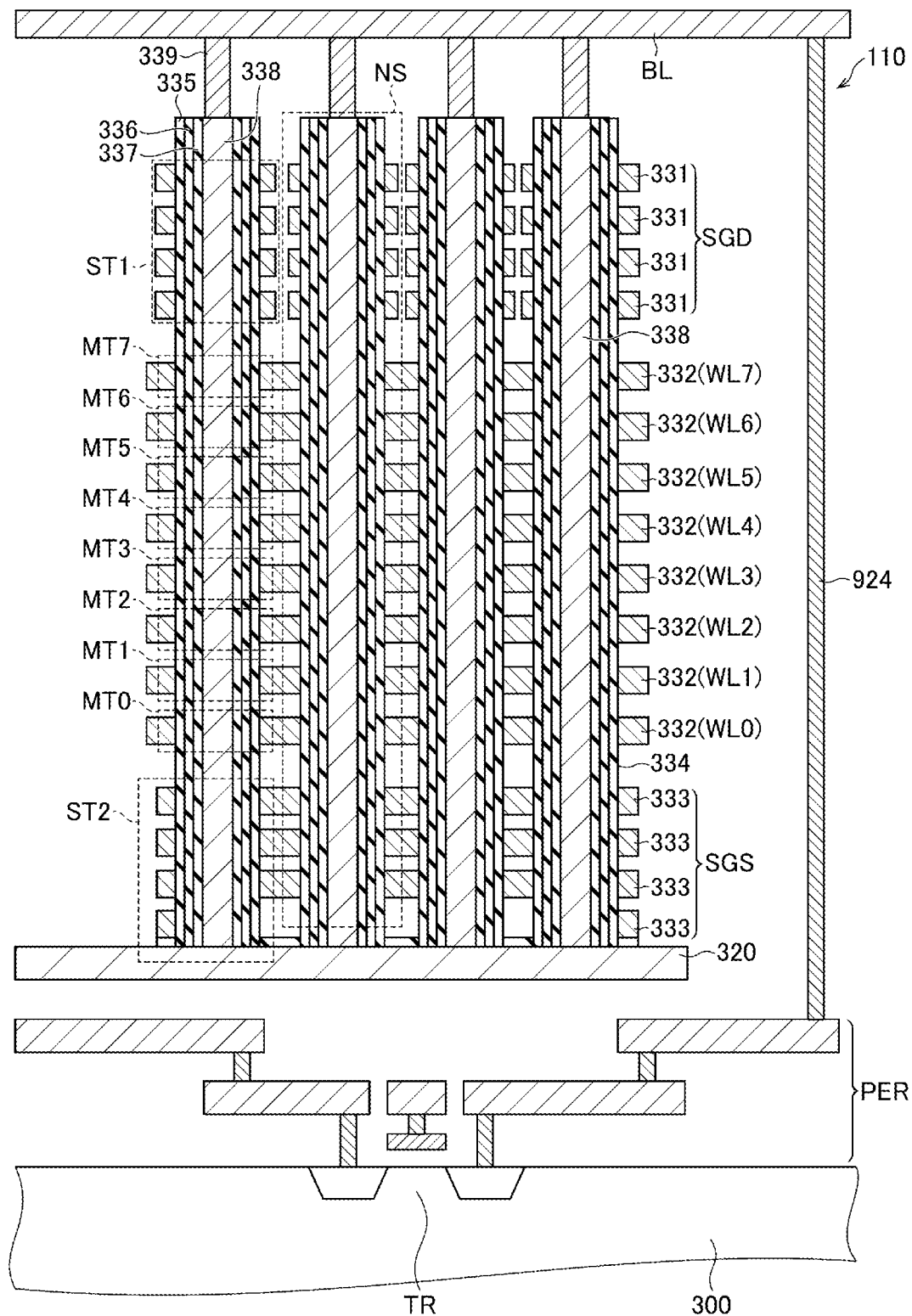
FIG. 5 is a cross-sectional view illustrating a configuration of a memory cell array.

FIG. 5 illustrates a configuration of the memory cell array 110 and the periphery thereof as a schematic cross-sectional view. As illustrated in this drawing, in the memory cell array 110, a plurality of NAND strings NS are formed on a conductive layer 320. The conductive layer 320 is also referred to as a buried source line BSL and corresponds to the source line SL in FIG. 4.

A plurality of wiring layers 333 functioning as the select gate line SGS, a plurality of wiring layers 332 functioning as the word line WL, and a plurality of wiring layers 331 functioning as the select gate line SGD are stacked above the conductive layer 320. An insulating layer (not illustrated) is disposed between the respective stacked wiring layers 333, 332 and 331.

A plurality of memory holes 334 are formed in the memory cell array 110. The memory hole 334 is a hole that vertically penetrates the wiring layers 333, 332 and 331 and the insulating layers (not illustrated) therebetween and reaches the conductive layer 320. A block insulating film 335, a charge storage layer 336, and a gate insulating film 337 are sequentially formed on the side surface of the memory hole 334, and a conductive column 338 is further buried therein. The conductive column 338 is made of, for example, polysilicon, and functions as a region where a channel is formed during an operation of the memory cell transistors MT and the select transistors ST1 and ST2 provided in the NAND string NS. In this way, a columnar body including the block insulating film 335, the charge storage layer 336, the gate insulating film 337, and the conductive column 338 is formed inside the memory hole 334.

Each portion of the columnar body formed inside the memory hole 334 intersecting with each of the stacked wiring layers 333, 332 and 331 functions as a transistor. Among such a plurality of transistors, one intersecting with the wiring layer 331 functions as the select transistor ST1. Among the plurality of transistors, one intersecting with the wiring layer 332 functions as the memory cell transistor MT (MO0 to MT7). Among the plurality of transistors, one intersecting with the wiring layer 333 functions as the select transistor ST2. With this configuration, each columnar body formed in each memory hole 334 functions as the NAND string NS described with reference to FIG. 4. The conductive column 338 provided in the columnar body is a part that functions as a channel of the memory cell transistor MT and the select transistors ST1 and ST2.

A wiring layer that functions as the bit line BL is formed above the conductive column 338. A contact plug 339 is formed on the upper end of the conductive column 338 to interconnect the conductive column 338 and the bit line BL.

The same configuration as that illustrated in FIG. 5 is provided in plurality, which are arranged along the depth direction of the paper of FIG. 5. One string unit SU is formed by a set of a plurality of NAND strings NS arranged side by side in a line along the depth direction of the paper of FIG. 5.

In the semiconductor memory device 2 according to the present embodiment, a peripheral circuit PER is provided under the memory cell array 110, i.e., at a position between the memory cell array 110 and a semiconductor substrate 300. The peripheral circuit PER is a circuit provided to realize a data write operation, read operation, and erase operation in the memory cell array 110. The sense amplifier 120, the row decoder 130, the voltage generation circuit 43, etc. illustrated in FIG. 3 are a part of the peripheral circuit PER. The peripheral circuit PER includes various transistors and RC circuits. In the example illustrated in FIG. 5, the transistor TR formed on the semiconductor substrate 300 and the bit line BL located above the memory cell array 110 are electrically connected to each other via a contact 924.

Instead of this configuration, there may be a configuration in which the memory cell array 110 is provided directly on the semiconductor substrate 300. In this case, a p-type well region of the semiconductor substrate 300 functions as the source line SL. Further, the peripheral circuit PER is provided at a position adjacent to the memory cell array 110 along the surface of the semiconductor substrate 300.

Returning to FIG. 3, the description thereof will be continued. As described above, the plane PL1 includes the sense amplifier 120 and the row decoder 130, in addition to the memory cell array 110 described above.

The sense amplifier 120 is a circuit for adjusting the voltage applied to the bit line BL, or reading out the voltage of the bit line BL to convert it into data. When reading out data, the sense amplifier 120 acquires the read data which is read out from the memory cell transistor MT to the bit line BL, and transfers the acquired read data to the input/output circuit 21. When writing data, the sense amplifier 120 transfers the write data written via the bit line BL to the memory cell transistor MT.

The row decoder 130 is a circuit configured as a switch group (not illustrated) for applying a voltage to each word line WL. The row decoder 130 receives a block address and a row address from the register 42, and selects a corresponding block BLK based on that block address and also selects a corresponding word line WL based on that row address. The row decoder 130 switches the opening and closing of the above-mentioned switch group so that a voltage is applied from the voltage generation circuit 43 to the selected word line WL.

Figure 6:
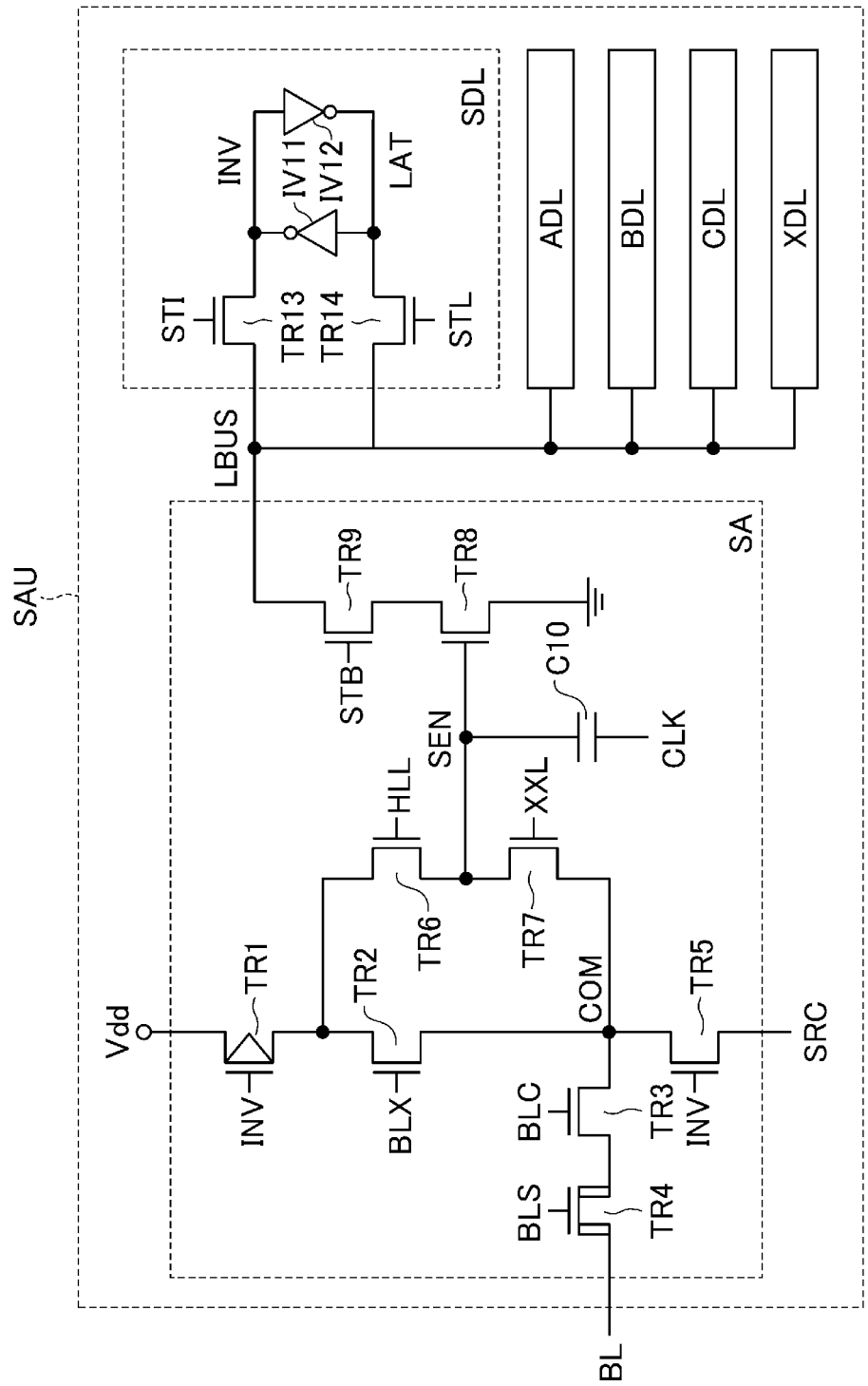
FIG. 6 is a diagram illustrating a circuit configuration of a sense amplifier unit.

FIG. 6 illustrates a configuration example of the sense amplifier 120. The sense amplifier 120 includes a plurality of sense amplifier units SAU associated respectively with a plurality of bit lines BL. FIG. 6 illustrates an extracted detailed circuit configuration of one of these sense amplifier units SAU.

As illustrated in FIG. 6, the sense amplifier unit SAU includes a sense amplifier section SA and latch circuits SDL, ADL, BDL, CDL, and XDL. The sense amplifier section SA and the latch circuits SDL, ADL, BDL, CDL, and XDL are connected by a bus LBUS to enable the transmission and reception of data therebetween.

For example, in a read operation, the sense amplifier section SA senses data read out to a corresponding bit line BL, and determines whether the read data is "0" or "1". The sense amplifier section SA includes, for example, a transistor TR1 which is a p-channel MOS transistor, transistors TR2 to TR9 which are n-channel MOS transistors, and a capacitor C10.

One end of the transistor TR1 is connected to a power supply line, and the other end of the transistor TR1 is connected to the transistor TR2. The gate of the transistor TR1 is connected to a node INV in the latch circuit SDL. One end of the transistor TR2 is connected to the transistor TR1, and the other end of the transistor TR2 is connected to a node COM. A signal BLX is input to the gate of the transistor TR2. One end of the transistor TR3 is connected to the node COM, and the other end of the transistor TR3 is connected to the transistor TR4. A signal BLC is input to the gate of the transistor TR3. The transistor TR4 is a high breakdown voltage MOS transistor. One end of the transistor TR4 is connected to the transistor TR3. The other end of the transistor TR4 is connected to the corresponding bit line BL. A signal BLS is input to the gate of the transistor TR4.

One end of the transistor TR5 is connected to the node COM, and the other end of the transistor TR5 is connected to a node SRC. The gate of the transistor TR5 is connected to the node INV. One end of the transistor TR6 is connected between the transistor TR1 and the transistor TR2, and the other end of the transistor TR6 is connected to a node SEN. A signal HLL is input to the gate of the transistor TR6. One end of the transistor TR7 is connected to the node SEN, and the other end of the transistor TR7 is connected to the node COM. A signal XXL is input to the gate of the transistor TR7.

One end of the transistor TR8 is grounded, and the other end of the transistor TR8 is connected to the transistor TR9. The gate of the transistor TR8 is connected to the node SEN. One end of the transistor TR9 is connected to the transistor TR8, and the other end of the transistor TR9 is connected to the bus LBUS. A signal STB is input to the gate of the transistor TR9. One end of the capacitor C10 is connected to the node SEN. A clock CLK is input to the other end of the capacitor C10.

The signals BLX, BLC, BLS, HLL, XXL, and STB are generated by, for example, the sequencer 41. Further, for example, a voltage Vdd, which is the internal power supply voltage of the semiconductor memory device 2, is applied to the power supply line connected to one end of the transistor TR1, and for example, the voltage Vss, which is the ground voltage of the semiconductor memory device 2, is applied to the node SRC.

The latch circuits SDL, ADL, BDL, CDL, and XDL temporarily store the read data. The latch circuit XDL is connected to the input/output circuit 21 and is used for the input/output of data between the sense amplifier unit SAU and the input/output circuit 21. The read data is stored in the latch circuit XDL, thereby being able to be output from the input/output circuit 21 to the memory controller 1. For example, the data read out by the sense amplifier unit SAU is stored in any of the latch circuits ADL, BDL, and CDL, and thereafter, is transferred to the latch circuit XDL and is output from the latch circuit XDL to the input/output circuit 21. Further, for example, the data input from the memory controller 1 to the input/output circuit 21 is transferred from the input/output circuit 21 to the latch circuit XDL, and is transferred from the latch circuit XDL to any of the latch circuits ADL, BDL, and CDL.

The latch circuit SDL includes, for example, inverters IV11 and IV12 and transistors TR13 and TR14 which are re-channel MOS transistors. The input node of the inverter IV11 is connected to a node LAT. The output node of the inverter IV11 is connected to a node INV. The input node of the inverter IV12 is connected to the node INV. The output node of the inverter IV12 is connected to the node LAT. One end of the transistor TR13 is connected to the node INV, and the other end of the transistor TR13 is connected to the bus LBUS. A signal STI is input to the gate of the transistor TR13. One end of the transistor TR14 is connected to the node LAT, and the other end of the transistor TR14 is connected to the bus LBUS. A signal STL is input to the gate of the transistor TR14. For example, the data stored in the node LAT corresponds to the data stored in the latch circuit SDL. Further, the data stored in the node INV corresponds to the inverted data of the data stored in the node LAT. A circuit configuration of the latch circuits ADL, BDL, CDL, and XDL is the same as, for example, a circuit configuration of the latch circuit SDL, and thus, the description thereof will be omitted.

Figure 7:
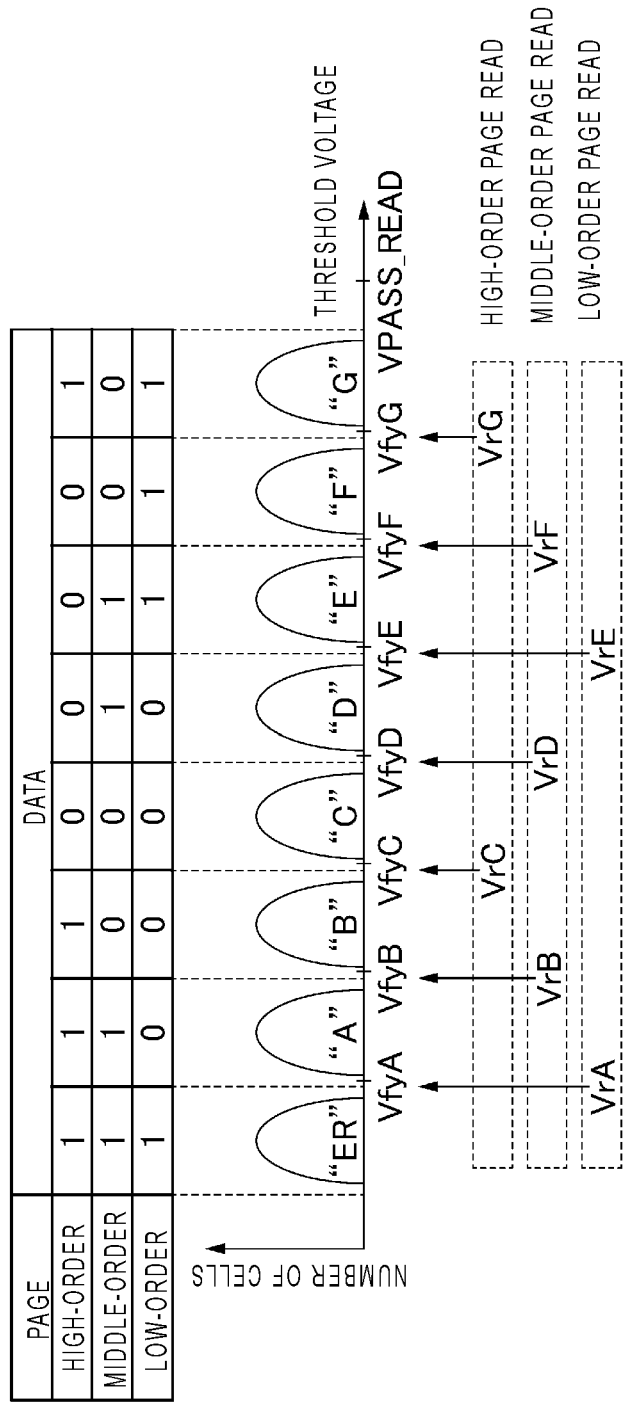
FIG. 7 is a diagram illustrating an example of a threshold voltage distribution of a memory cell transistor.

FIG. 7 is diagram schematically illustrating a threshold voltage distribution of the memory cell transistor MT. The diagram in the middle of FIG. 7 represents a correspondence between the threshold voltage of the memory cell transistor MT (horizontal axis) and the number of memory cell transistors MT (vertical axis).

When adopting the TLC method as in the present embodiment, a plurality of memory cell transistors MT form eight threshold voltage distributions as illustrated in the middle of FIG. 7. These eight threshold voltage distributions (each representing one of eight write states) are referred to as, in order from the lowest threshold voltage, the "ER" state, the "A" state, the "B" state, the "C" state, the "D" state, the "E" state, the "F" state, and the "G" state.

The table in the upper end of FIG. 7 represents an example of data assigned to correspond to each of the above respective states of the threshold voltage. As illustrated in this table, for example, different 3-bit data is assigned as illustrated below to each of the "ER" state, the "A" state, the "B" state, the "C" state, the "D" state, the "E" state, the "F" state, and the "G" state:

"ER" state: "111" ("low-order bit/middle-order bit/high-order bit");
"A" state: "011";
"B" state: "001";
"C" state: "000";
"D" state: "010";
"E" state: "110";
"F" state: "100"; and
"G" state: "101".

As described above, the threshold voltage of the memory cell transistor MT in the present embodiment may take one of eight preset candidate states, and data is assigned as described above to correspond to each candidate state.

A verify voltage used for a write operation is set between a pair of respective neighboring threshold voltage distributions. Specifically, verify voltages VfyA, VfyB, VfyC, VfyD, VfyE, VfyF, and VfyG are set to correspond to the "A" state, the "B" state, the "C" state, the "D" state, the "E" state, the "F" state, and the "G" state, respectively.

The verify voltage VfyA is set between the maximum threshold voltage in the "ER" state and the minimum threshold voltage in the "A" state. When the verify voltage VfyA is applied to the word line WL, among the memory cell transistors MT connected to that word line WL, the memory cell transistor MT which has the threshold voltage included in the "ER" state is turned on and the memory cell transistor MT which has the threshold voltage included in the threshold voltage distribution equal to or higher than the "A" state is turned off.

The other verify voltages VfyB, VfyC, VfyD, VfyE, VfyF, and VfyG are also set in the same manner as the above verify voltage VfyA. The verify voltage VfyB is set between the "A" state and the "B" state, the verify voltage VfyC is set between the "B" state and the "C" state, and the verify voltage VfyD is set between the "C" state and the "D" state, the verify voltage VfyE is set between the "D" state and the "E" state, the verify voltage VfyF is set between the "E" state and the "F" state, and the verify voltage VfyG is set between the "F" state and the "G" state.

For example, the verify voltage VfyA may be set to 0.8 V, the verify voltage VfyB may be set to 1.6 V, the verify voltage VfyC may be set to 2.4 V, the verify voltage VfyD may be set to 3.1 V, the verify voltage VfyE may be set to 3.8 V, the verify voltage VfyF may be set to 4.6 V, and the verify voltage VfyG may be set to 5.6 V. However, without being limited thereto, the verify voltages VfyA, VfyB, VfyC, VfyD, VfyE, VfyF, and VfyG may be appropriately set in the stepwise manner in a range of, for example, 0 V to 7.0 V.

Further, a read voltage used in each read operation is set between the neighboring threshold voltage distributions. The "read voltage" is a voltage applied to the word line WL connected to the memory cell transistor MT which is a read target, i.e., to a selected word line during a read operation. In the read operation, data is determined based on the result of determining whether or not the threshold voltage of the memory cell transistor MT which is the read target is higher than the applied read voltage.

As schematically illustrated in the lower end of FIG. 7, specifically, a read voltage VrA which determines whether the threshold voltage of the memory cell transistor MT is included in the "ER" state or is included in the "A" state or higher is set between the maximum threshold voltage in the "ER" state and the minimum threshold voltage in the "A" state.

The other read voltages VrB, VrC, VrD, VrE, VrF, and VrG are also set in the same manner as the above read voltage VrA. The read voltage VrB is set between the "A" state and the "B" state, the read voltage VrC is set between the "B" state and the "C" state, the read voltage VrD is set between the "C" state and the "D" state, the read voltage VrE is set between the "D" state and the "E" state, the read voltage VrF is set between the "E" state and the "F" state, and the read voltage VrG is set between the "F" state and the "G" state.

A read pass voltage VPASS_READ is set to a voltage higher than the maximum threshold voltage of the highest threshold voltage distribution (e.g., the "G" state). The memory cell transistor MT having the gate to which the read pass voltage VPASS_READ is applied is turned on regardless of data stored therein.

Meanwhile, the verify voltages VfyA, VfyB, VfyC, VfyD, VfyE, VfyF, and VfyG are set to, for example, voltages higher than the read voltages VrA, VrB, VrC, VrD, VrE, VrF, and VrG, respectively. That is, the verify voltages VfyA, VfyB, VfyC, VfyD, VfyE, VfyF, and VfyG are respectively set near the lower end of the threshold voltage distribution of the "A" state, the "B" state, the "C" state, the "D" state, the "E" state, the "F" state, and the "G" state.

When the data assignment as described above is applied, one page data of the low-order bit (low-order page data) in the read operation may be determined by the read result using the read voltages VrA and VrE. One page data of the middle-order bit (middle-order page data) may be determined by the read result using the read voltages VrB, VrD, and VrF. One page data of the high-order bit (high-order page data) may be determined by the read result using the read voltages VrC and VrG. In this way, since the low-order page data, the middle-order page data, and the high-order page data are determined respectively by two read operations, three read operations, and two read operations, the data assignment as described above is referred to as the "2-3-2 code".

Meanwhile, the data assignment as described above is merely an example, and the actual data allocation is not limited to this. For example, data of 2 bits, or 4 bits or more may be stored in one memory cell transistor MT. Further, the number of threshold voltage distributions to which data is assigned (i.e., the number of "candidate states" described above) may be 7 or less, or 9 or more. For example, instead of the "2-3-2 code", the "1-3-3 code" or the "1-2-4 code" may be used. Further, for example, the allocation of the low-order bit/middle-order bit/high-order bit may be changed. More specifically, for example, in the "2-3-2 code", the data may be assigned in such a manner that the low-order page data is determined by the read result using the read voltages VrC and VrB, the middle-order page data is determined by the read result using the read voltages VrB, VrD, and VrF, and the high-order page data is determined by the read result using the read voltages VrA and VrE. That is, for example, the assignment of the low-order bit and the high-order bit may be reversed. In this case, the data is assigned as follows to correspond to each state of the threshold voltage:

"ER" state: "111" ("low-order bit/middle-order bit/high-order bit");
"A" state: "110";
"B" state: "100";
"C" state: "000";
"D" state: "010";
"E" state: "011";
"F" state: "001"; and
"G" state: "101".

A write operation performed in the semiconductor memory device 2 will be described. In the write operation, a program operation and a verify operation are performed. The "program operation" is an operation of changing the threshold voltage of some memory cell transistors MT by injecting electrons into the charge storage layer 336 of these memory cell transistors MT. The "verify operation" is an operation of determining and verifying whether or not the threshold voltage of the memory cell transistor MT reached a target state by reading out data after the above program operation. The memory cell transistor MT having a threshold voltage that has reached the target state is subsequently write-inhibited. The "target state" as used herein is a specific candidate state set as the target state among the eight candidate states described above.

In the write operation, the program operation and the verify operation described above are repeatedly executed. Thus, the threshold voltage of the memory cell transistor MT rises to the target state.

Among a plurality of word lines WL, the word line WL connected to the memory cell transistor MT which is a target of the write operation (i.e., a target for changing the threshold voltage) is hereinafter also referred to as a "selected word line". Further, the word line WL connected to the memory cell transistor MT which is not the target of the write operation is hereinafter also referred to as a "non-selected word line". The memory cell transistor MT which is a write target is hereinafter also referred to as a "selected memory transistor".

Among a plurality of string units SU, a string unit SU which is a target of the write operation is hereinafter also referred to as a "selected string unit". Further, the string unit SU which is not the target of the write operation is hereinafter also referred to as a "non-selected string unit".

The conductive column 338 of each NAND string NS provided in the selected string unit, i.e., each channel in the selected string unit is hereinafter also referred to as a "selected channel". Further, the conductive column 338 of each NAND string NS provided in the non-selected string unit, i.e., each channel in the non-selected string unit is hereinafter also referred to as a "non-selected channel".

Among a plurality of bit lines BL, the bit line BL connected to the selected memory transistor is hereinafter also referred to as a "selected bit line". Further, the bit line BL not connected to the selected memory transistor is hereinafter also referred to as a "non-selected bit line".

Figure 8:
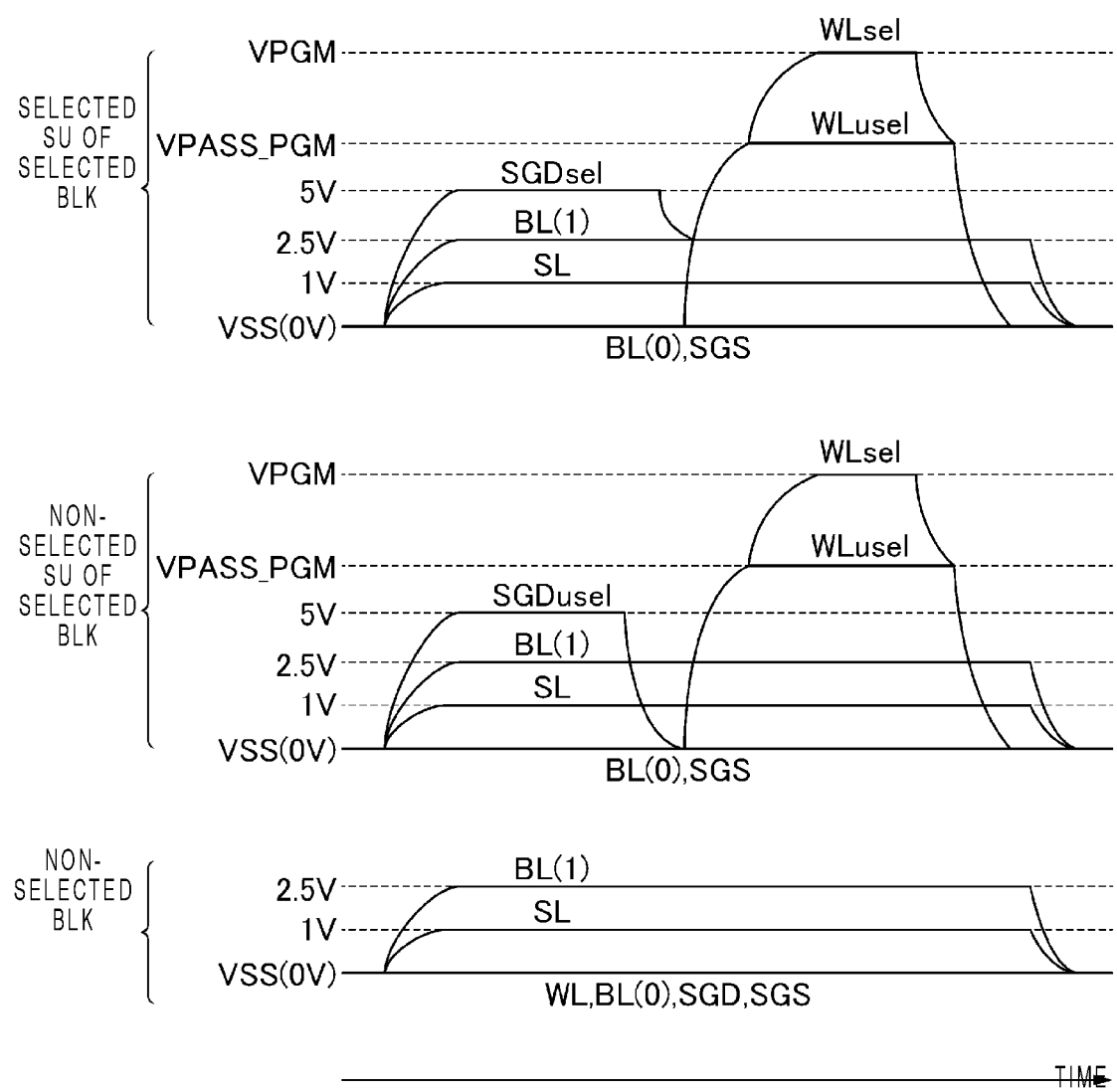
FIG. 8 is a diagram illustrating changes in voltages of each wiring during a write operation.

A program operation will be described. Hereinafter, an example in a case where a target of the program operation is the plane PL1 will be described, but a case of the plane PL2 is also the same as the following. FIG. 8 illustrates a change in voltages of each wiring during a program operation. In the program operation, the sense amplifier 120 changes the voltage of each bit line BL to correspond to program data. For example, the ground voltage Vss (0 V) is applied as the "L" level to the bit line BL connected to the memory cell transistor MT which is a program target (for which the threshold voltage is to be raised). For example, 2.5 V is applied as the "H" level to the bit line BL connected to the memory cell transistor MT which is not the program target (for which the threshold voltage is to be maintained). The former bit line BL is denoted as "BL(0)" in FIG. 8. The latter bit line BL is denoted as "BL(1)" in FIG. 8.

The row decoder 130 selects, as a target of the write operation, any one block BLK and further selects any one string unit SU. More specifically, for example, 5 V is applied via the row decoder 130 from the voltage generation circuit 43 to the select gate line SGD (selected select gate line SGDsel) in the selected string unit SU. Thus, the select transistor ST1 is turned on. Meanwhile, for example, the voltage Vss is applied via the row decoder 130 from the voltage generation circuit 43 to the select gate line SGS. Thus, the select transistor ST2 is turned off.

Further, for example, a voltage of 5 V is applied via the row decoder 130 from the voltage generation circuit 43 to the select gate line SGD (non-selected select gate line SGDusel) of the non-selected string unit SU in the selected block BLK. Thus, the select transistor ST1 is turned on. In the string unit SU provided in each block BLK, the select gate line SGS is connected in common. Accordingly, the select transistor ST2 is turned off even in the non-selected string unit SU.

Further, for example, the voltage Vss is applied via the row decoder 130 from the voltage generation circuit 43 to the select gate line SGD and the select gate line SGS in the non-selected block BLK. Thus, the select transistor ST1 and the select transistor ST2 are turned off.

The source line SL has a voltage higher than the voltage of the select gate line SGS. This voltage is, for example, 1 V.

Thereafter, the voltage of the selected select gate line SGDsel in the selected block BLK is set to, for example, 2.5 V. This voltage turns on the select transistor ST1 corresponding to the bit line BL(0) to which 0 V is applied in the above example, but cuts off the select transistor ST1 corresponding to the bit line BL(1) to which 2.5 V is applied. Thus, in the selected string unit SU, the select transistor ST1 corresponding to the bit line BL(0) is turned on, and the select transistor ST1 corresponding to the bit line BL(1) to which 2.5 V is applied is cut off. Meanwhile, the voltage of the non-selected select gate line SGDusel is, for example, the voltage Vss. Thus, in the non-selected string unit SU, the select transistor ST1 is cut off regardless of the voltages of the bit line BL(0) and the bit line BL(1).

Then, the row decoder 130 selects any one word line WL as a target of the write operation in the selected block BLK. For example, the voltage VPGM is applied via the row decoder 130 from the voltage generation circuit 43 to the word line WL (selected word line WLsel) which is the target of the write operation. Meanwhile, for example, the voltage VPASS_PGM is applied via the row decoder 130 from the voltage generation circuit 43 to the other word line WL (non-selected word lines WLusel). The voltage VPGM is a high voltage for injecting electrons into the charge storage layer 336 by a tunnel phenomenon. The voltage VPASS_PGM is a voltage that turns on the memory cell transistor MT connected to the word line WL and does not change the threshold constant voltage. The voltage VPGM is higher than the voltage VPASS_PGM.

In the NAND string NS corresponding to the bit line BL(0) which is the program target, the select transistor ST1 is turned on. Therefore, the channel voltage of the memory cell transistor MT connected to the selected word line WLsel becomes 0 V. Since the voltage difference between the control gate and the channel increases, and as a result, electrons are injected into the charge storage layer 336, the threshold voltage of the memory cell transistor MT rises.

In the NAND string NS corresponding to the bit line BL(1) which is not the program target, the select transistor ST1 is in the cut-off state. Therefore, the channel of the memory cell transistor MT connected to the selected word line WLsel goes into an electrically floating state, and the channel voltage rises to near the voltage VPGM by capacitive coupling with the word line WL. Since the voltage difference between the control gate and the channel decreases, and, as a result, electrons are not injected into the charge storage layer 336, the threshold voltage of the memory cell transistor MT is maintained. To be precise, the threshold voltage does not fluctuate to the extent that transition of the threshold voltage distribution state to a higher distribution occurs.

Figure 9:
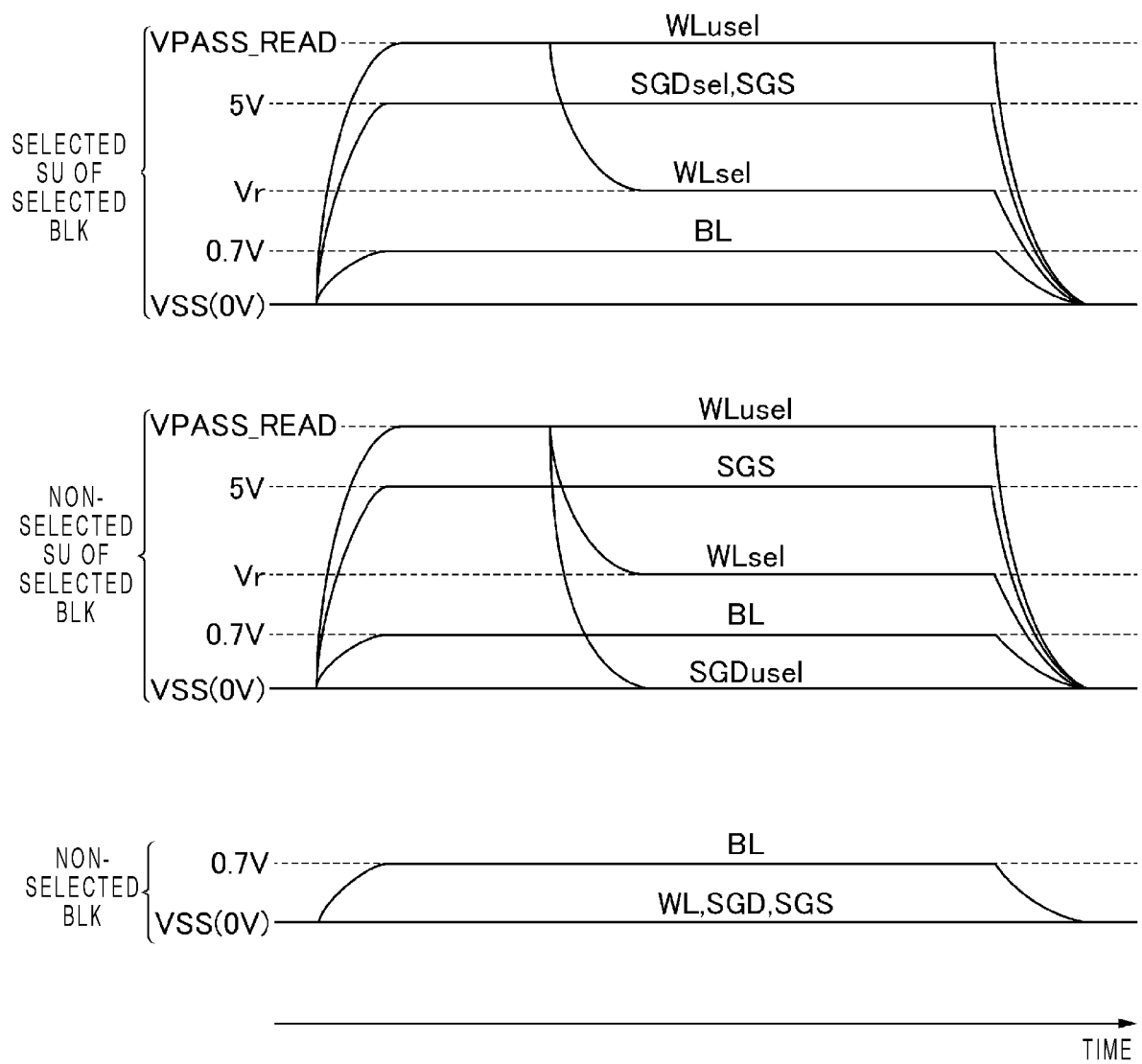
FIG. 9 is a diagram illustrating changes in voltages of each wiring during a read operation.

A read operation will be described. Hereinafter, an example in a case where a target of the read operation is the plane PL1 will be described, but a case of the plane PL2 is also the same as the following. A verify operation performed following a program operation is the same as the read operation described below. FIG. 9 illustrates changes in the voltage of each wiring during a read operation. In the read operation, the NAND string NS including the memory cell transistor MT which is a target of the read operation is selected. Alternatively, the string unit SU including a page which is a target of the read operation is selected.

First, for example, 5 V is applied via the row decoder 130 from the voltage generation circuit 43 to the selected select gate line SGDsel, the non-selected select gate line SGDusel, and the select gate line SGS. Thus, the select transistor ST1 and the select transistor ST2 provided in the selected block BLK are turned on. Further, for example, the read pass voltage VPASS_READ is applied via the row decoder 130 from the voltage generation circuit 43 to the selected word line WLsel and the non-selected word line. The read pass voltage VPASS_READ is a voltage that may turn on the memory cell transistor MT regardless of the threshold voltage of the memory cell transistor MT and does not change the threshold constant voltage. Thus, the current is conducted through all the NAND strings NS provided in the selected block BLK regardless of whether the NAND string NS is in the selected string unit SU or in the non-selected string unit SU.

Next, for example, a read voltage Vr such as VrA is applied via the row decoder 130 from the voltage generation circuit 43 to the word line WL (selected word line WLsel) connected to the memory cell transistor MT which is a target of the read operation. The read pass voltage VPASS_READ is applied to the other word line (non-selected word line WLusel).

Further, for example, the voltage Vss is applied via the row decoder 130 from the voltage generation circuit 43 to the non-selected select gate line SGDusel while maintaining the voltage applied to the selected select gate line SGDsel and select gate line SGS. Thus, the select transistor ST1 provided in the selected string unit SU remains in the On state, but the select transistor ST1 provided in the non-selected string unit SU is turned off. The select transistor ST2 provided in the selected block BLK is turned on regardless of whether it is in the selected string unit SU or in the non-selected string unit SU.

Thus, the NAND string NS provided in the non-selected string unit SU does not form a current path because at least the select transistor ST1 is turned off. Meanwhile, in the NAND string NS provided in the selected string unit SU, a current path is formed or not formed according to a relationship between the read voltage Vr applied to the selected word line WLsel and the threshold voltage of the memory cell transistor MT.

The sense amplifier 120 applies a voltage to the bit line BL connected to the selected NAND string NS. In this state, the sense amplifier 120 reads out data based on the value of current flowing through that bit line BL. Specifically, it is determined whether or not the threshold voltage of the memory cell transistor MT which is a target of the read operation is higher than the read voltage applied to that memory cell transistor MT. Meanwhile, the data may be read out not based on the value of current flowing through the bit line BL, but based on a change over time in the voltage of the bit line BL. In the latter case, the bit line BL is pre-charged so as to have a predetermined voltage in advance.

The above-described verify operation is also performed in the same manner as the read operation as described above. In the verify operation, for example, a verify voltage such as VfyA is applied via the row decoder 130 from the voltage generation circuit 43 to the word line WL connected to the memory cell transistor MT which is a verify target.

The operation of applying a voltage of 5 V to the selected select gate line SGDsel and the non-selected select gate line SGDusel in the initial stage of the program operation described above may be omitted. Similarly, the operation of applying a voltage of 5 V to the non-selected select gate line SGDusel and applying the read pass voltage VPASS_READ to the selected word line WLsel in the initial stage of the read operation (or verify operation) described above may be omitted.

A specific flow of signals transmitted and received between the semiconductor memory device 2 and the memory controller 1 during a read operation will be described. Hereinafter, an example in a case where a target of the read operation is the plane PL1 will be described, but a case of the plane PL2 is also the same as the following.

Figure 10:
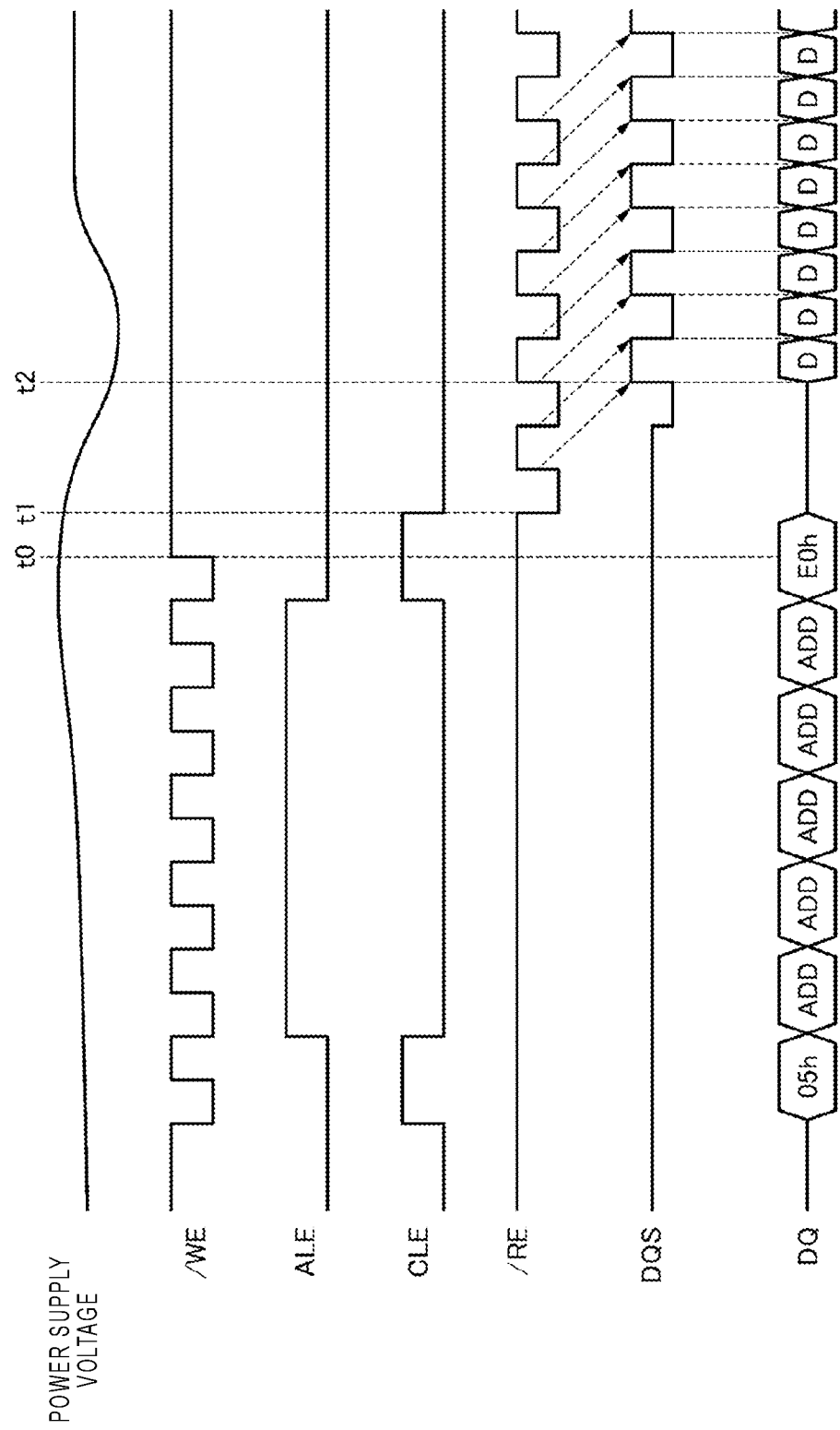
FIG. 10 is a diagram illustrating an example of changes over time in signals transmitted and received between a semiconductor memory device and a memory controller according to a comparative example.

First, a comparative example of the present embodiment will be described. FIG. 10 illustrates an example of various signals transmitted and received between the semiconductor memory device 2 and the memory controller 1 in a configuration according to a comparative example.

During a read operation, signals including "05h", a plurality of "ADDs", and "E0h" are sequentially input as the signal DQ<7:0> from the memory controller 1 to the semiconductor memory device 2. "05h" is a command for executing an operation of reading out data from the memory cell array 110. "ADD" is a signal that designates an address of a data read source. "E0h" is a command for starting the read operation.

In FIG. 10, the timing at which "E0h" is input to the semiconductor memory device 2 is indicated as the time to. At the time t1 after the lapse of a predetermined period from the time t0, the memory controller 1 starts to toggle the read enable signal /RE. As described above, the read enable signal /RE is a signal for the memory controller 1 to read out data from the semiconductor memory device 2 and is input to the input/output pad group 31 of the semiconductor memory device 2. After the time t1, the read enable signal /RE is alternately switched (toggled) between the H level and the L level. Each read enable signal /RE switched in this way is used as a "read signal" for reading out data. The input/output pad group 31 corresponds to a "reception unit" that repeatedly receives the "read signal" from the memory controller 1.

The semiconductor memory device 2 outputs data through the data signal DQ<7:0> and also switches the data strobe signal DQS between the H level and the L level whenever the read enable signal /RE is completely switched (that is, whenever each read signal is input). In FIG. 10, each data output through the data signal DQ<7:0> is indicated as "D". Further, the timing at which the first data is output and the data strobe signal DQS is switched is indicated as the time t2. A correspondence between the switching of the read enable signal /RE input from the memory controller 1 and the switching of the data strobe signal DQS output from the semiconductor memory device 2 is indicated by the dotted arrows in FIG. 10.

Meanwhile, the output of the read data from the semiconductor memory device 2 is performed by dividing one data into even data including even-numbered bits and odd data including odd-numbered bits, and then outputting each of them alternately. Each data indicated by "D" in FIG. 10 is output as either even data or odd data.

During the read operation, in the plane PL1, it is necessary to open or close a large number of transistors including the memory cell transistor MT. At this time, since the current output from the voltage generation circuit 43 to each part is increased, the power supply voltage may temporarily drop. More specifically, when the power supply voltage is controlled by feedback control, the current output from the voltage generation circuit 43 to each part is increased, whereby the power supply voltage may temporarily drop. An example of a change in the power supply voltage fluctuating as described above is illustrated in the uppermost section of FIG. 10. In this example, the power supply voltage starts to drop at or near the time t0 at which the toggle of the read enable signal /RE is started, and drops below a target voltage for a while even after the time t2. When such a drop in the power supply voltage occurs, there is a concern that the I/O output characteristics of the semiconductor memory device 2 will deteriorate and the output of the read data will become unstable.

Figure 11:
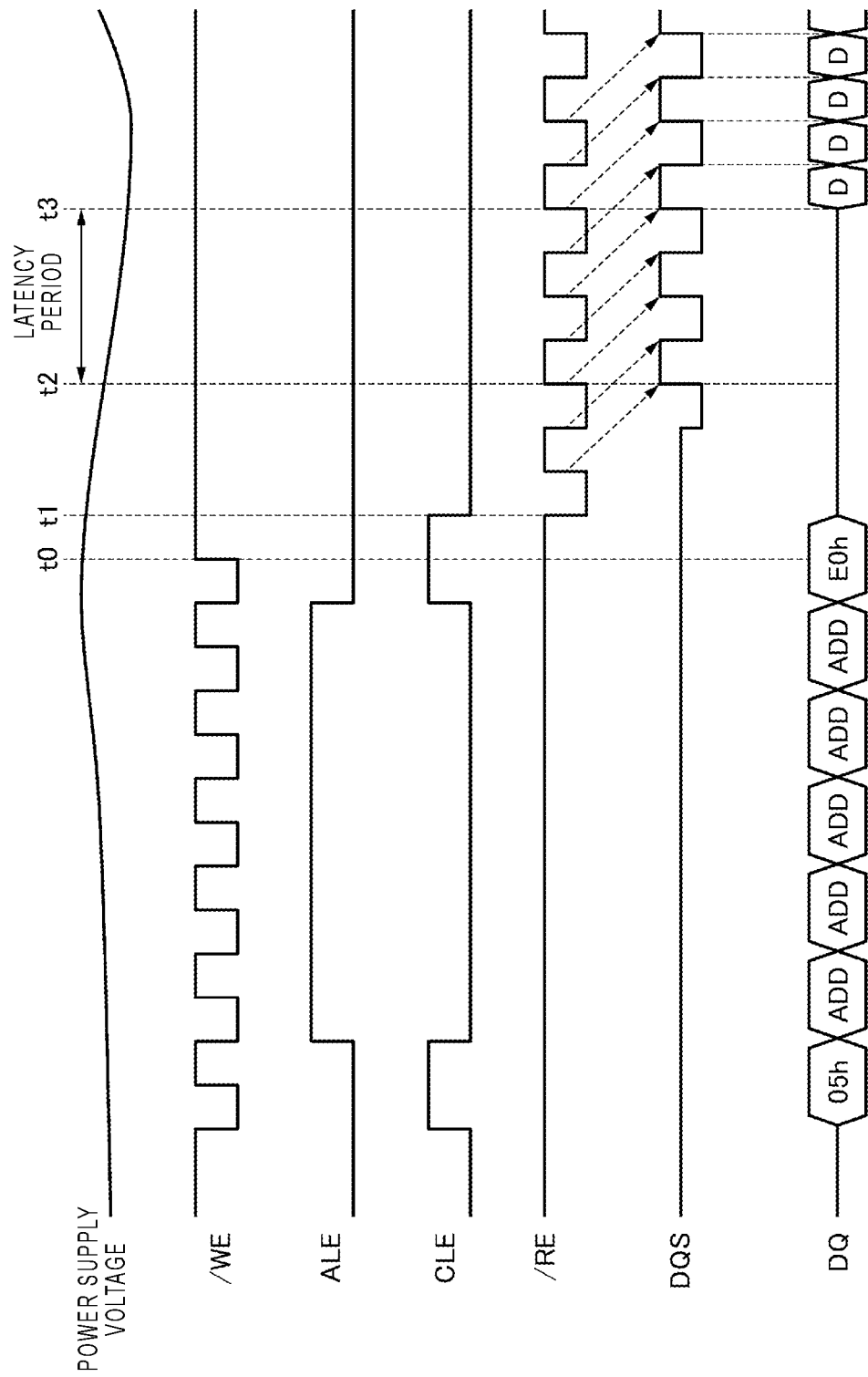
FIG. 11 is a diagram illustrating an example of changes over time in signals transmitted and received between a semiconductor memory device and a memory controller according to another comparative example.

As a countermeasure against a drop in the power supply voltage, for example, it is conceivable to operate the semiconductor memory device 2 as illustrated in FIG. 11. FIG. 11 illustrates an example of various transmitted and received signals according to a comparative example different from the comparative example of FIG. 10.

In the comparative example of FIG. 11, the semiconductor memory device 2 starts to toggle the data strobe signal DQS at the same timing (time t2) as that of the comparative example of FIG. 10. However, the semiconductor memory device 2 does not output data to the memory controller 1 for a while after starting to toggle the data strobe signal DQS. The output of data from the semiconductor memory device 2 is started from the time t3 after the time t2. The length of the period from the time t2 to the time t3 in this example is the length of the period during which a total of four even data or odd data may be output (in other words, the length of the period during which two even data and two odd data may be output). The period from when the toggle of the data strobe signal DQS is started until the output of data requested by the memory controller 1 is started is hereinafter also referred to as a "latency period".

If the latency period is provided as in the comparative example of FIG. 11, since the timing of outputting data is later than the time t2, the power supply voltage may be prevented from temporarily dropping at the point in time when the output of data is started. In other words, if the latency period is provided as in the comparative example of FIG. 11, the output of data may be started in a state where a temporarily drop in the power supply voltage, due to an increase in current caused by starting to toggle the data strobe signal DQS, is prevented. However, when the output of data is started at the time t3, the current is increased due to this. In other words, even if the start of the output of data is delayed from the start of the toggle of the data strobe signal DQS as in the comparative example of FIG. 11, the effect caused by a temporary drop in the power supply voltage due to an increase in current caused by starting the output of data is unavoidable.

Figure 12:
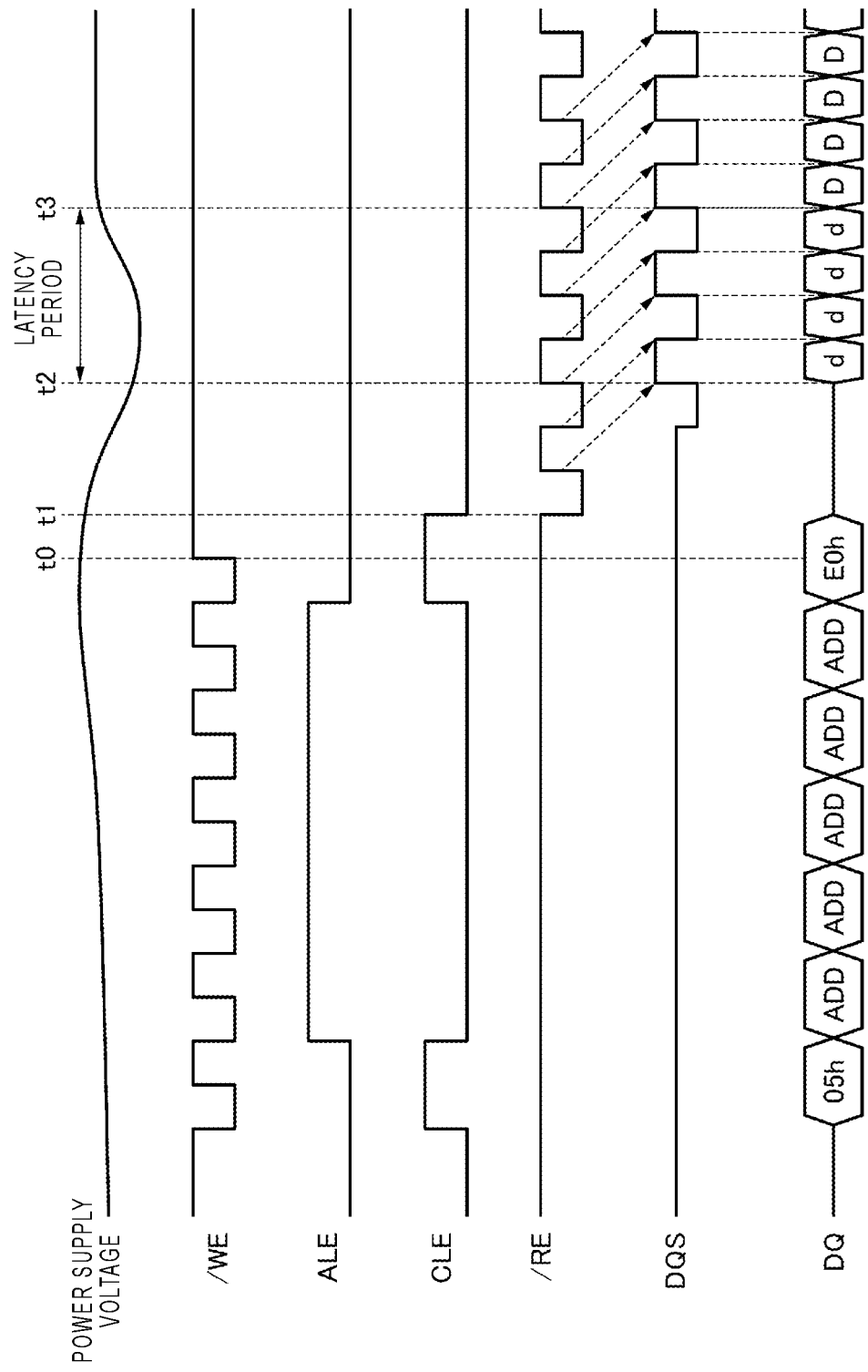
FIG. 12 is a diagram illustrating an example of changes over time in signals transmitted and received between a semiconductor memory device and a memory controller according to an embodiment.

Accordingly, the semiconductor memory device 2 according to the present embodiment operates as follows during the read operation. FIG. 12 illustrates an example of various signals transmitted and received by the semiconductor memory device 2 according to the present embodiment.

In the present embodiment, the same latency period as in the example of FIG. 11 is provided, and the output of data requested by the memory controller 1 is started from the time t3. However, in the present embodiment, data is output from the semiconductor memory device 2 to the memory controller 1 even during the latency period. The data output at this time is dummy data different from the data requested by the memory controller 1. Such dummy data is hereinafter also referred to as "non-normal data". Further, the read data requested by the memory controller 1 is hereinafter also referred to as "normal data" to distinguish it from the non-normal data. In FIG. 12, among the data output as the signal DQ<7:0>, the normal data is denoted by "D" as in FIG. 10, and the non-normal data is denoted by "d". Meanwhile, each data indicated by "d" is individual data output as either even data or odd data.

In the semiconductor memory device 2 according to the present embodiment, the output current from the voltage generation circuit 43 is increased at the time t2 at which the latency period begins, but the output current from the voltage generation circuit 43 is not increased at the time t3 at which the latency period ends. Therefore, as illustrated in FIG. 12, the power supply voltage drops significantly immediately after the time t2, but is recovered to some extent at the point in time before the time t3. In the semiconductor memory device 2 according to the present embodiment, as illustrated in FIG. 12, since the normal data is transmitted from the semiconductor memory device 2 to the memory controller 1 after the power supply voltage is stabilized, the above problem of a deterioration in the I/O output characteristics may be solved. Meanwhile, in the memory controller 1, if it is determined in advance to ignore the non-normal data input (e.g., to discard the non-normal data after reception) during the latency period, the non-normal data does not adversely affect the read operation.

A specific configuration of the semiconductor memory device 2 for enabling the transmission of the non-normal data d during the latency period will be described with reference mainly to FIG. 13. In this drawing, a configuration along a path from the memory cell array 110 to the input/output pad group 31, i.e., a path through which read data flows is schematically depicted.

The sense amplifier 120 includes a plurality of sense amplifier units SAU described above, a plurality of latch circuits XDL, and a multiplexer 121. The data read from the memory cell array 110 is transmitted from the sense amplifier unit SAU to the latch circuit XDL and is stored once, and then is transmitted to a first storing unit 510 via the multiplexer 121. The multiplexer 121 and the first storing unit 510 are connected to each other by, for example, a first data bus 501 including 128 wirings. The number of wirings provided in the first data bus 501 is not limited to 128. The number of wirings provided in the first data bus 501 is smaller than the number of wirings interconnecting the plurality of latch circuits XDL and the multiplexer 121. The multiplexer 121 sequentially transfers each data transmitted from the plurality of latch circuits XDL to the first storing unit 510 in the subsequent stage via the first data bus 501.

The first storing unit 510 stores a plurality of data read out from the memory cell array 110, and is a storage device configured to perform a so-called "First-In-First-Out (FIFO)" operation. The first storing unit 510 temporarily stores a plurality of data transferred from the multiplexer 121, and outputs that data to the input/output circuit 21 in order from the previously input data. The first storing unit 510 and the input/output circuit 21 are connected to each other via, for example, a second data bus 502 including 16 signal lines. The number of wirings provided in the second data bus 502 is not limited to 16. The data input from the first storing unit 510 to the input/output circuit 21 is temporarily stored by a second storing unit 520 to be described later, and then is output as the data signal DQ<7:0> from the input/output pad group 31 to the outside.

The input/output circuit 21 includes the second storing unit 520, a write pointer generation circuit 541, a read pointer generation circuit 542, a multiplexer 531, and a driver 532. A circuit formed by combining these is individually provided to correspond to each of eight pads of the input/output pad group 31, i.e., eight pads corresponding to DQ<7:0>. That is, in the input/output circuit 21, eight second storing units 520 and eight multiplexers 531 are provided. In FIG. 13, among these, only ones connected to the pad of DQ<0> are illustrated, and the illustration of the others is omitted.

The second storing unit 520 receives and stores a plurality of data transmitted from the first storing unit 510. The second storing unit 520 of the present embodiment is divided into a part that stores even data and a part that stores odd data. The one storing even data is hereinafter also referred to as a "second storing unit 521". The one storing odd data is hereinafter also referred to as a "second storing unit 522".

The second storing unit 520 is a storage device configured to perform a so-called "First-In-First-Out (FIFO)" operation, similarly to the first storing unit 510 described above. The second storing unit 520 temporarily receives the data input from the first storing unit 510 as described above, and then outputs that data to the pad of DQ<0> in order from the previously input data. Such output of data is alternately performed from each of the second storing unit 521 and the second storing unit 522 via the multiplexer 531 and the driver 532.

The write pointer generation circuit 541 is a circuit that generates a write pointer Wptr. The "write pointer Wptr" is a pointer that references a data storing position within the second storing unit 520 (i.e., a write position) when the second storing unit 520 stores the data transmitted from the first storing unit 510.

The read pointer generation circuit 542 is a circuit that generates a read pointer Rptr. The "read pointer Rptr" is a pointer that references a data storing position within the second storing unit 520 (i.e., a read position) when data is transmitted from the second storing unit 520 to the driver 532.

A pair of circuits including the write pointer generation circuit 541 and the read pointer generation circuit 542 are provided for each of the second storing unit 521 and the second storing unit 522. However, in FIG. 13, only the write pointer generation circuit 541 and the read pointer generation circuit 542 provided for the second storing unit 522 are illustrated, and the illustration of the write pointer generation circuit 541 and the read pointer generation circuit 542 provided for the second storing unit 521 is omitted.

The transmission of data from the first storing unit 510 to the second storing unit 520 and the transmission of data from the second storing unit 520 to the multiplexer 531 are controlled respectively by the sequencer 41.

Figure 14:
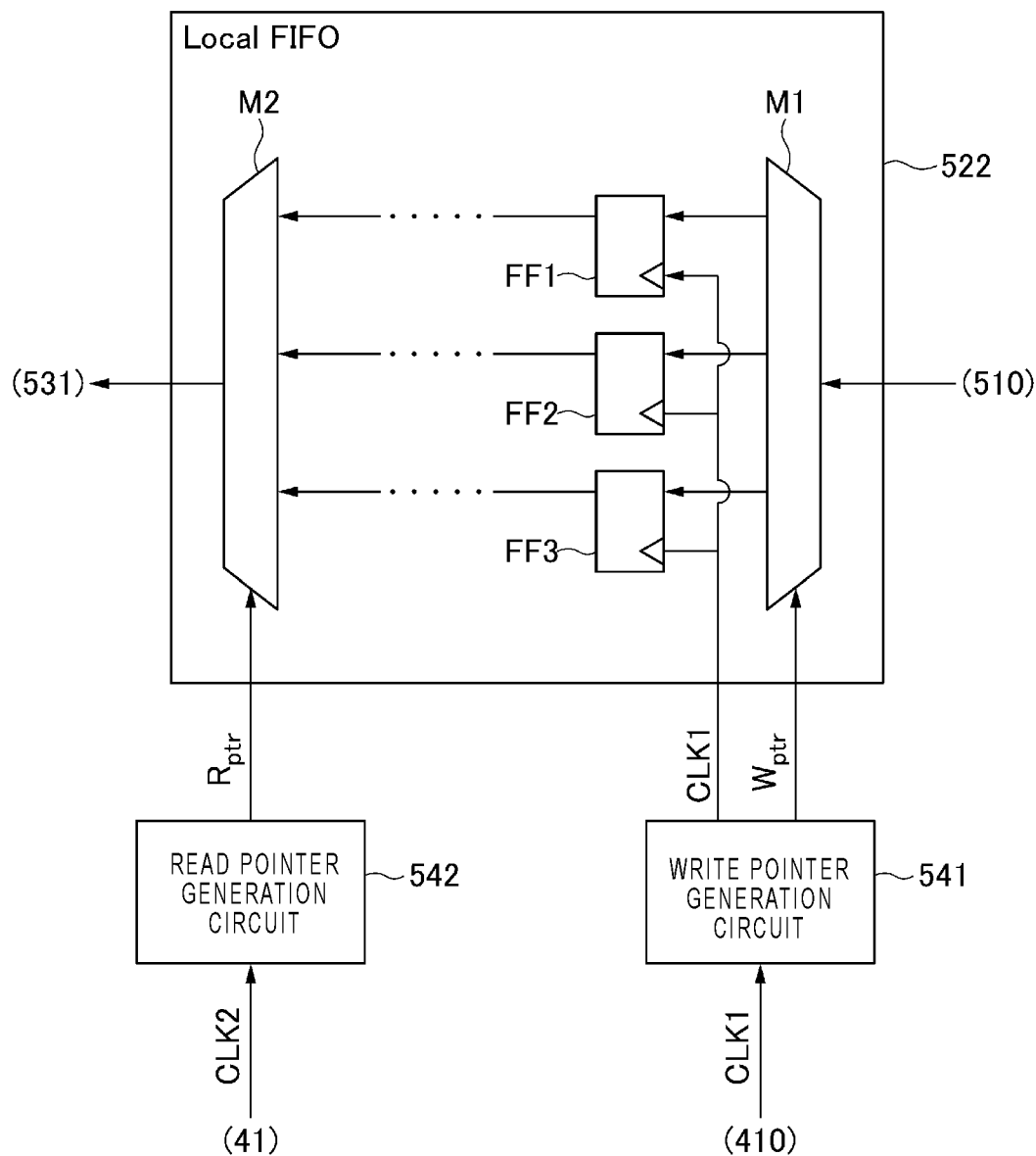
FIG. 14 is a diagram illustrating a configuration of a storing unit.

A configuration of the second storing unit 520 and the functions of the write pointer generation circuit 541 and the read pointer generation circuit 542 will be described. In FIG. 14, a configuration of the second storing unit 522 is schematically depicted. Meanwhile, since the configuration of the second storing unit 521 is the same as the configuration of the second storing unit 522, the description thereof will be omitted.

As illustrated in FIG. 14, the second storing unit 522 includes a multiplexer M1, a plurality of flip-flops FFs (only three of which are depicted in FIG. 14 as "FF1", "FF2", and "FF3"), and a multiplexer M2.

The multiplexer M1 selects any one flip-flop FF as a data write target based on the write pointer Wptr input from the write pointer generation circuit 541, and transmits data to that flip-flop FF.

Each flip-flop FF functions as a storage location for 1-bit data in the second storing unit 522. At the timing at which an input clock signal CLK1 rises from the L level to the H level, the flip-flop FF outputs the data stored up to that timing to the multiplexer M2 side and also stores new data input from the multiplexer M1 side.

The clock signal CLK1 is a signal that defines the timing at which each flip-flop FF inserts data. The clock signal CLK1 is generated by the sequencer 41. The clock signal CLK1 is input from the sequencer 41 to each flip-flop FF via a latency circuit 410 to be described later and the write pointer generation circuit 541.

The write pointer generation circuit 541 generates the write pointer Wptr based on the input clock signal CLK1. The write pointer Wptr is incremented by the write pointer generation circuit 541 at the timing at which the clock signal CLK1 rises from the L level to the H level. The write pointer Wptr is a signal that designates the flip-flop FF to which data input from the first storing unit 510 is to be inserted. As the write pointer Wptr is incremented, the flip-flop FF which is a data write target is sequentially switched.

The multiplexer M2 selects any one flip-flop FF as a data read target based on the read pointer Rptr input from the read pointer generation circuit 542, and receives data from that flip-flop FF. The multiplexer M2 outputs that data to the multiplexer 531 side at the timing at which the read pointer Rptr is incremented.

The read pointer Rptr is a signal that designates from which flip-flop FF to output data to the multiplexer 531 side and also designates the timing of outputting data. The read pointer Rptr is generated by the read pointer generation circuit 542, and is input from the read pointer generation circuit 542 to the multiplexer M2.

The read pointer generation circuit 542 generates the read pointer Rptr based on an input clock signal CLK2. The read pointer Rptr is incremented and is input to the multiplexer M2 by the read pointer generation circuit 542 at the timing at which the clock signal CLK2 rises from the L level to the H level. As the read pointer Rptr is incremented, the flip-flop FF which is a data read target is sequentially switched. The order in which the flip-flop FF which is a data read target is switched is the same as the order in which the flip-flop FF which is a data write target is switched. Thus, the FIFO operation by the second storing unit 522 is realized.

The clock signal CLK2 is a signal that is the source of the read pointer Rptr as described above. The clock signal CLK2 is generated by the sequencer 41 based on the read enable signal /RE input from the memory controller 1. As illustrated in FIG. 13, the clock signal CLK2 is input from the sequencer 41 to the read pointer generation circuit 542 and is also input to the multiplexer 531.

The multiplexer 531 alternately receives even data input from the second storing unit 521 and odd data input from the second storing unit 522, and outputs these to the driver 532.

Alternatively, there may be a configuration in which a plurality of flip-flops FFs are arranged side by side in multiple stages from the multiplexer M1 to the multiplexer M2. Further, the first storing unit 510 described above may also have the same configuration as the second storing unit 522 as described above.

It can be understood that the second storing unit 520 which performs the FIFO operation has a plurality of data storage locations arranged side by side in a predetermined order. In FIGS. 15A and 15B, such a configuration of the second storing unit 520 is schematically depicted. In FIGS. 15A and 15B, each square depicted side by side in a horizontal line represents a data storage location (specifically, flip-flop FF). Each storage location is depicted side by side in a line from the left to the right in FIGS. 15A and 15B according to the order of writing (and reading out) data. Each of the write pointer Wptr and the read pointer Rptr is incremented to the right in FIGS. 15A and 15B along the arrows.

FIG. 15A illustrates the state of the second storing unit 520 at the point in time at which a data read command is input from the memory controller 1 and the semiconductor memory device 2 prepares to output data when the latency period is not set (when the length of the latency period is 0). The example of FIG. 12 is the state immediately before the time t1. In the semiconductor memory device 2, by performing a pre-fetch operation (pre-read operation), some of a series of data to be output from now on is stored in the second storing unit 520.

FIG. 15A illustrates an example in which normal data D0, D1, D2, D3 . . . are output in response to a request from the memory controller 1.

FIG. 15B illustrates the state of the second storing unit 520 at the point in time at which a data read command is input from the memory controller 1 and the semiconductor memory device 2 prepares to output data when the latency period is set. In this case, before the normal data D0, D1, D2, D3 . . . are output, the non-normal data . . . d3, d2, d1, d0 are output to correspond to the length of the latency period. More specifically, when the length of the latency period is 8, the non-normal data d3, d2, d1, d0 (d3$o$, d2$o$, d1$o$, d0$o$) are output from the second storing unit 522 corresponding to odd data before the normal data D0, D1, D2, D3 . . . (D0$o$, D1$o$, D2$o$, D3$o$ . . . ) are output. Similarly, the non-normal data d3, d2, d1, d0 (d3$e$, d2$e$, d1$e$, d0$e$) are also output from the second storing unit 521 corresponding to even data before the normal data D0, D1, D2, D3 . . . (D0$e$, D1$e$, D2$e$, D3$e$ . . . ) are output.

When the latency period is not set (when the length of the latency period is 0), as illustrated in FIG. 15A, the read pointer Rptr indicates the storage location of D0 which is output first. However, in the present embodiment, when the latency period is set, by adjusting the read pointer Rptr in advance so as to indicate the position on the minus side (left side in FIG. 15A) according to the length of the latency period, data different from D0 is output first. This processing is performed, for example, under the control of the sequencer 41.

For example, as in the example of FIG. 15B, when the latency period is set and the length thereof is 8, in each of the second storing unit 522 corresponding to odd data and the second storing unit 521 corresponding to even data, the read pointer Rptr is adjusted to be shifted, by 4 times, from the storing position of the first normal data D0 to the position on the minus side. By adjusting the read pointer Rptr to the position on the minus side as described above, d3*e*, d3*o*, d2*e*, d2*o*, d1*e*, d1*o*, d0*e*, and d0*o* are output in order as the non-normal data to the memory controller 1 before D0*e*, D0*o*, D1*e*, D1*o*, D2*o*, D2*e*, D3*o*, D3*e* . . . are output as the normal data.

Figure 16:
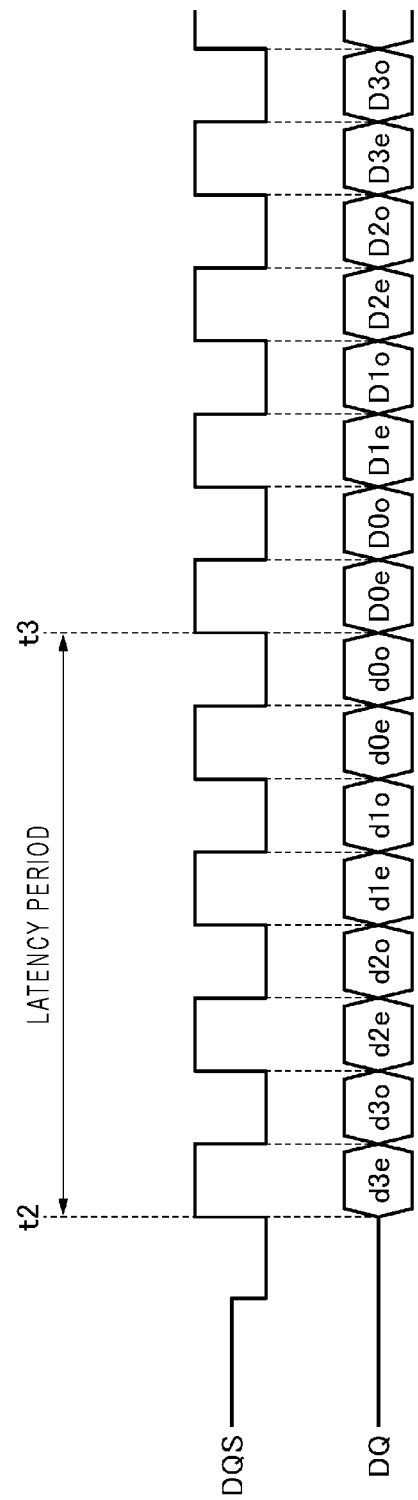
FIG. 16 is a diagram illustrating an example of changes over time in data signals transmitted and received between a semiconductor memory device and a memory controller according to an embodiment.

An example of a signal when data is output after the read pointer Rptr is adjusted as illustrated in FIG. 15B is illustrated in FIG. 16. "d3*e*" illustrated in this drawing represents data of d3 output as even data from the second storing unit 521, and "d3*o*" indicates data of d3 output as odd data from the second storing unit 522. The same is applied to other data such as "d2*e*", "d2*o*", "d1*e*", "d1*o*", "d0*e*", and "d0*o*", or "D0*e*", "D0*o*", "D1*e*", "D1*o*", "D2*e*", "D2*o*", and "D3*o*".

Figure 18:
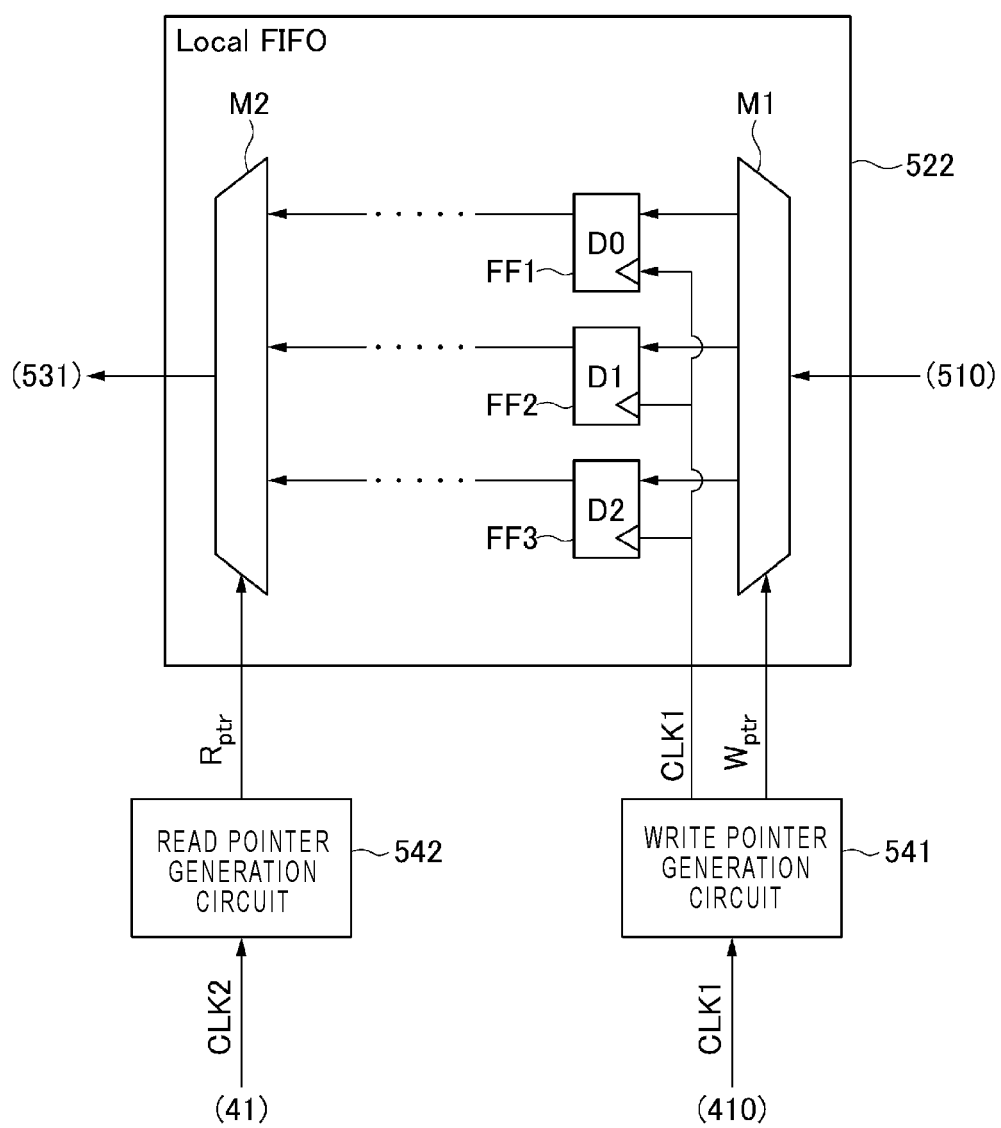
FIG. 18 is a diagram illustrating a relationship between data stored by a flip-flop circuit of a second storing unit and data output from the second storing unit during a latency period.

FIG. 18 illustrates a relationship between the data stored by the flip-flop circuits FF1, FF2, and FF3 of the second storing unit 520 and the data output from the second storing unit 520 during the latency period.

Figure 19:
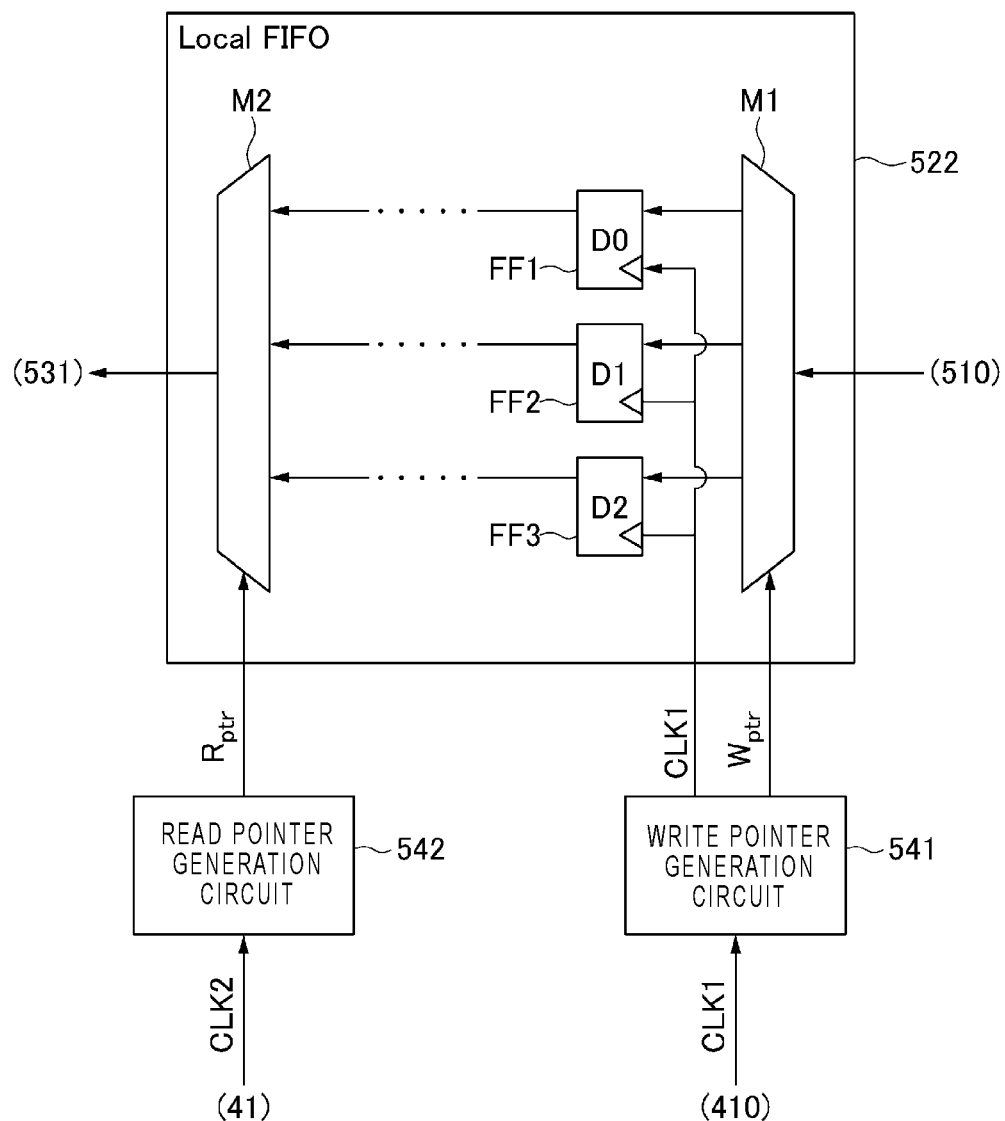
FIGS. 19-20 are diagrams illustrating a relationship between data stored by a flip-flop circuit of a second storing unit and data output from the second storing unit during a data output period after the end of a latency period.
Figure 20:
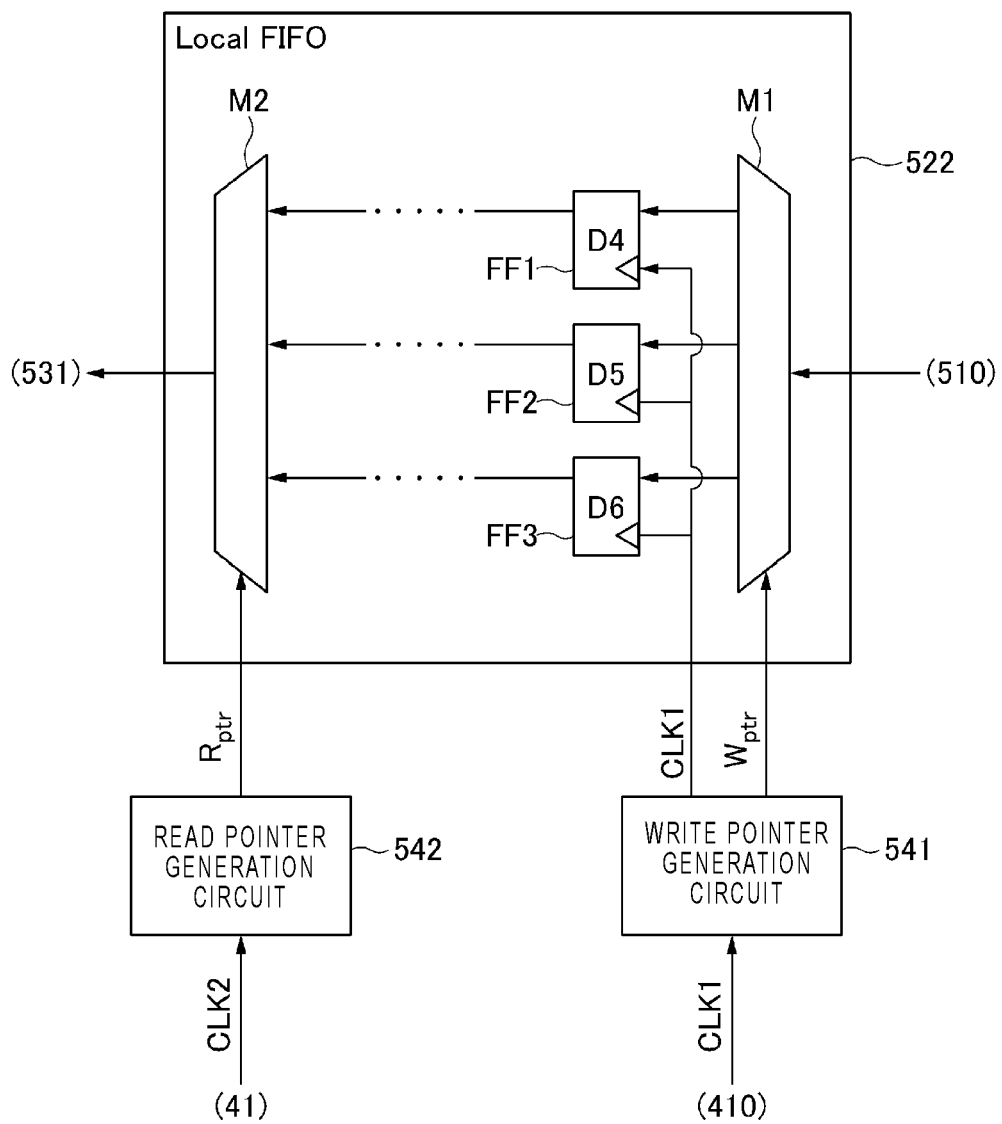

When the latency period ends, the second storing unit 520 starts to output the normal data. FIGS. 19 and 20 illustrate a relationship between the data stored by the flip-flop circuits FF1, FF2, and FF3 of the second storing unit 520 and the data output from the second storing unit 520 during a data output period after the end of the latency period.

In this example, the length of the latency period from the time t2 to the time t3 is set to the length of the period during which a total of eight even data or odd data may be output (in other words, the length of the period during which four even data and four odd data may be output). Therefore, in each of the second storing units 521 and 522, by moving the read pointer Rptr to the minus side by 4 times as described above, an operation of outputting the non-normal data during the latency period and outputting the normal data after the latency period may be realized.

If the write pointer Wptr is incremented for the latency period during which the non-normal data is output from the second storing unit 520, there is a possibility that some of data to be output will be overwritten without being output. Accordingly, in the semiconductor memory device 2 according to the present embodiment, the sequencer 41 temporarily stops the transmission of data from the first storing unit 510 to the second storing unit 520 for the latency period during which the non-normal data is transmitted from the second storing unit 520.

Figure 13:
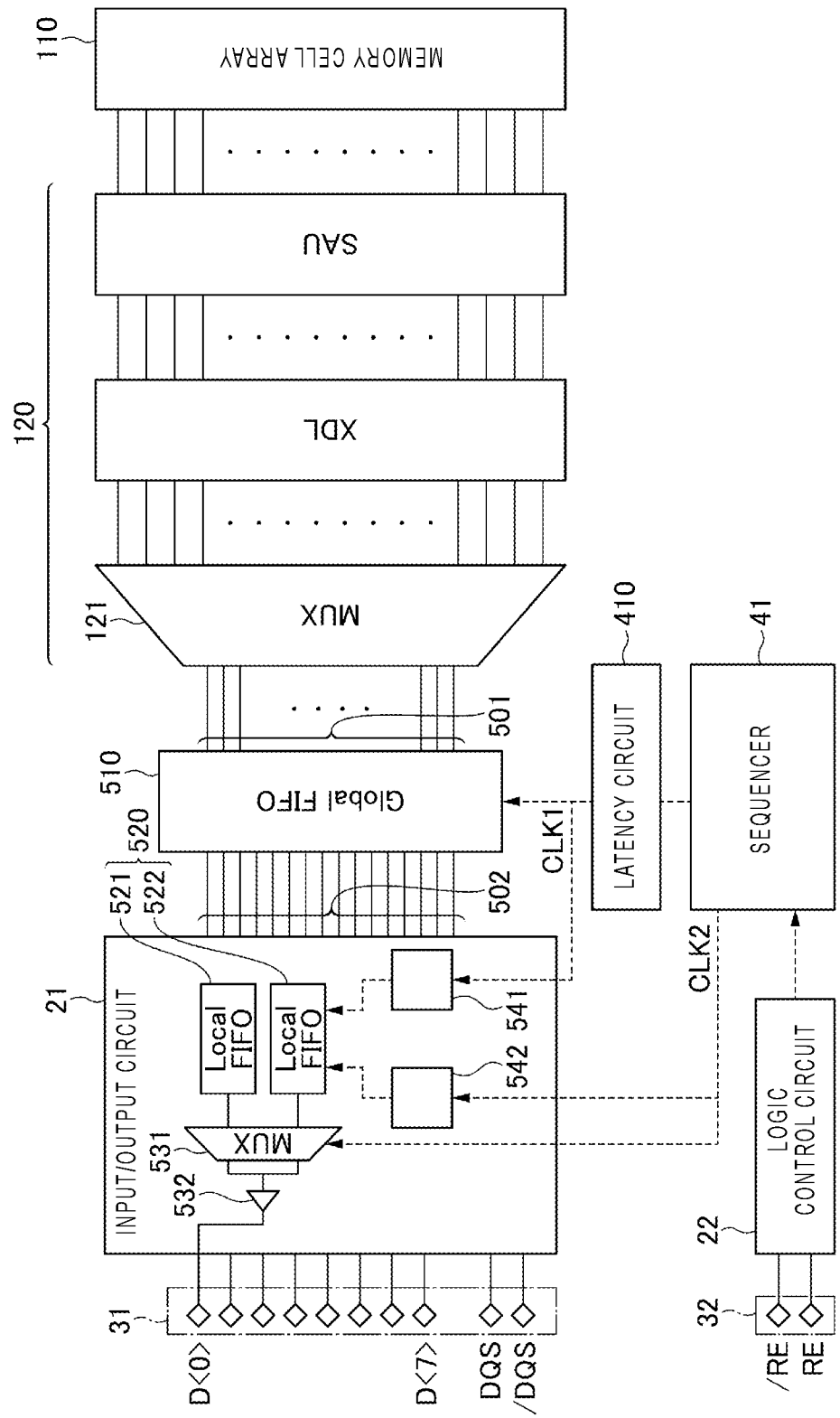
FIG. 13 is a diagram illustrating a configuration of a circuit for outputting data from a memory cell array to a memory controller in a memory system according to an embodiment.

The latency circuit 410 illustrated in FIG. 13 transmits the clock signal CLK1 output from the sequencer 41 to the first storing unit 510 or the write pointer generation circuit 541 in the subsequent stage. During the latency period, the latency circuit 410 temporarily stops the transmission of the clock signal CLK1. Specifically, the latency circuit 410 counts the clock signal CLK1 input from the sequencer 41, and at the point in time at which the clock signal CLK1 has counted a predetermined number of times for which the update of data needs to be stopped during the latency period, starts the transmission of the clock signal CLK1 to the subsequent stage.

As a result, during the latency period, the transmission of data from the first storing unit 510 to the second storing unit 520 is stopped. Thus, the data of the second storing unit 520 is prevented from being overwritten without being transmitted. The latency circuit 410 may be configured as a part of the sequencer 41.

As described above, the semiconductor memory device 2 according to the present embodiment includes the first storing unit 510 and the second storing unit 520 which temporarily store a plurality of data read from the memory cell array 110, an output unit (driver 532 or input/output pad group 31) which outputs data repeatedly transmitted from the second storing unit 520 to the external memory controller 1, a reception unit (logic control pad group 32 or logic control circuit 22) which repeatedly receives a read signal (read enable signal /RE) for reading out data from the memory controller 1, and a control unit (sequencer 41) which transmits data from the second storing unit 520 to the output unit in response to each read signal.

The sequencer 41, which is the control unit, transmits non-normal data different from data requested by the memory controller 1 from the storing unit to the output unit as data corresponding to each read signal received first a predetermined number of times by the reception unit, and transmits normal data which is data requested by the memory controller 1 from the storing unit to the output unit as data corresponding to the read signal subsequently received by the reception unit. Thus, since it is possible to return the dropped power supply voltage to near the normal value until the transmission of the normal data is started, the data may be stably output to the memory controller 1.

The sequencer 41, which is the control unit, adjusts in advance the read pointer Rptr indicating the storing position of data to be transmitted next toward the output unit among the plurality of data stored in the second storing unit 520 according to the above "predetermined number of times", thereby transmitting the non-normal data from the storing unit. Specifically, the sequencer 41 adjusts in advance the read pointer Rptr so as to indicate the storing position shifted from the storing position of the normal data to the minus side by a number corresponding to the predetermined number of times. Thus, it is possible to easily realize the output of non-normal data during the latency period.

Figure 17:
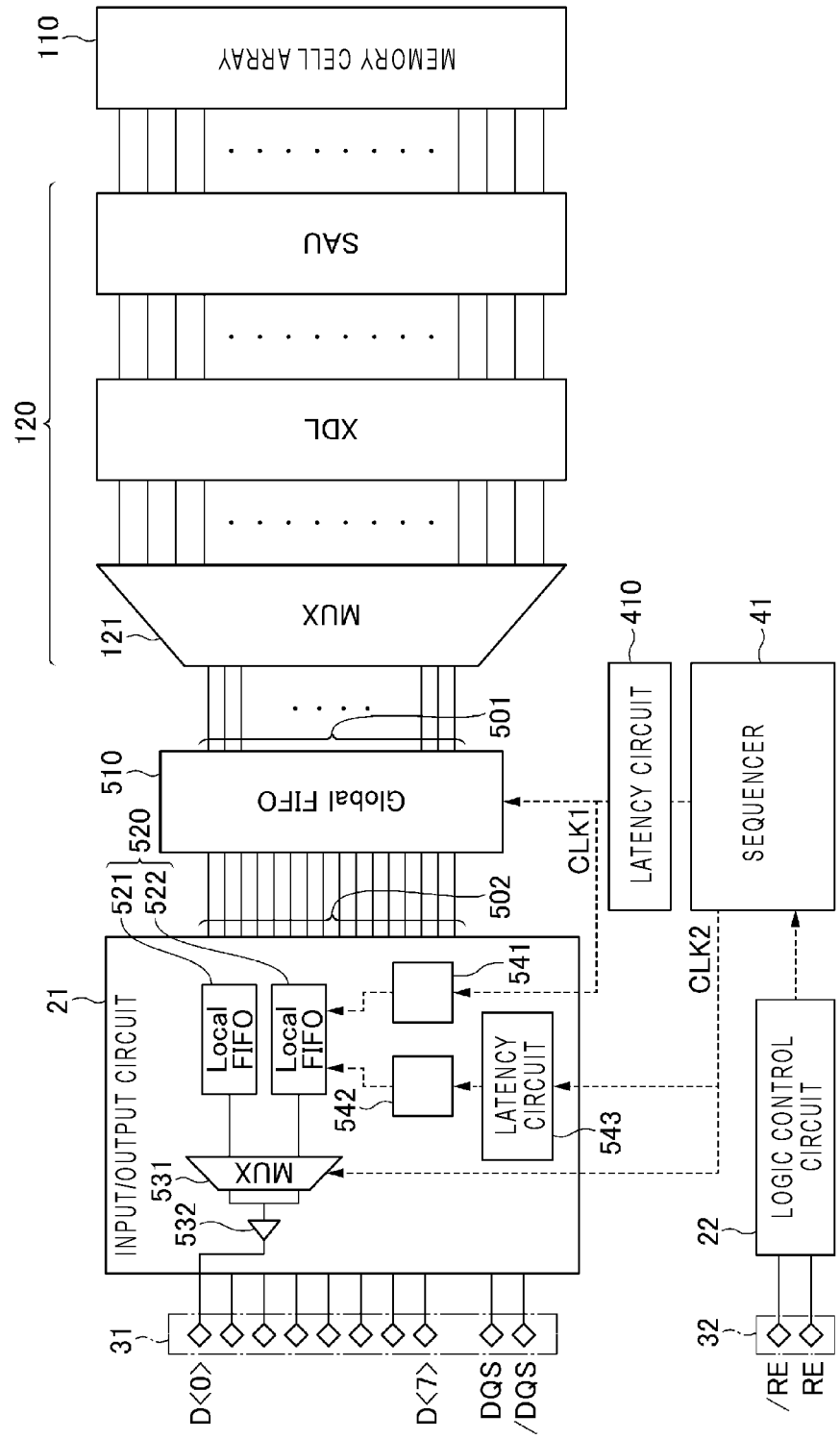
FIG. 17 is a diagram illustrating a configuration of a circuit for outputting data from a memory cell array to a memory controller in a memory system according to a comparative example.

Meanwhile, a configuration of a comparative example illustrated in FIG. 17 is also conceivable as the configuration of the semiconductor memory device 2 which transmits the non-normal data during the latency period. This comparative example differs from the present embodiment in that the input/output circuit 21 is provided with a latency circuit 543.

The latency circuit 543 transmits the clock signal CLK2 output from the sequencer 41 to the read pointer generation circuit 542 in the subsequent stage. During the latency period, the latency circuit 543 temporarily stops the transmission of the clock signal CLK2. Specifically, the latency circuit 543 counts the clock signal CLK2 input from the sequencer 41, and at the point in time at which the clock signal CLK2 is counted a predetermined number of times for which the update of data needs to be stopped during the latency period, starts the transmission of the clock signal CLK2 to the subsequent stage. Meanwhile, the clock signal CLK2 is continuously transmitted to the multiplexer 531 even during the latency period.

In this case, the data output from the second storing unit 520 is not updated during the latency period, and the same data indicated by the read pointer Rptr (which does not move and remains stopped) continues to be transmitted as non-normal data. When the latency period ends, the transmission of normal data is started as in the present embodiment.

Since the latency circuit 543 as described above needs to count the clock signal CLK2 which is switched at a high speed, it may be necessary to configure it with a high-speed transistor having relatively large power consumption. Furthermore, as the latency period becomes longer and the number of times to be counted increases a larger number of transistors are required and the latency circuit 543 becomes even larger. As a result, it may lead to an increase in power consumption or an increase in the size of the circuit. Further, since, during the latency period, the data output from the second storing unit 520 is not updated and the same data indicated by the read pointer Rptr which does not move and remains stopped continues to be transmitted as non-normal data, appropriate current load may not be applied to the voltage generation circuit.

In contrast, in the present embodiment, it is not necessary to temporarily stop the update of data output from the second storing unit 520 during the latency period. Therefore, since it is not necessary to provide the latency circuit 543 in the comparative example, an increase in power consumption or an increase in the size of the circuit may be avoided.

Figure 21:
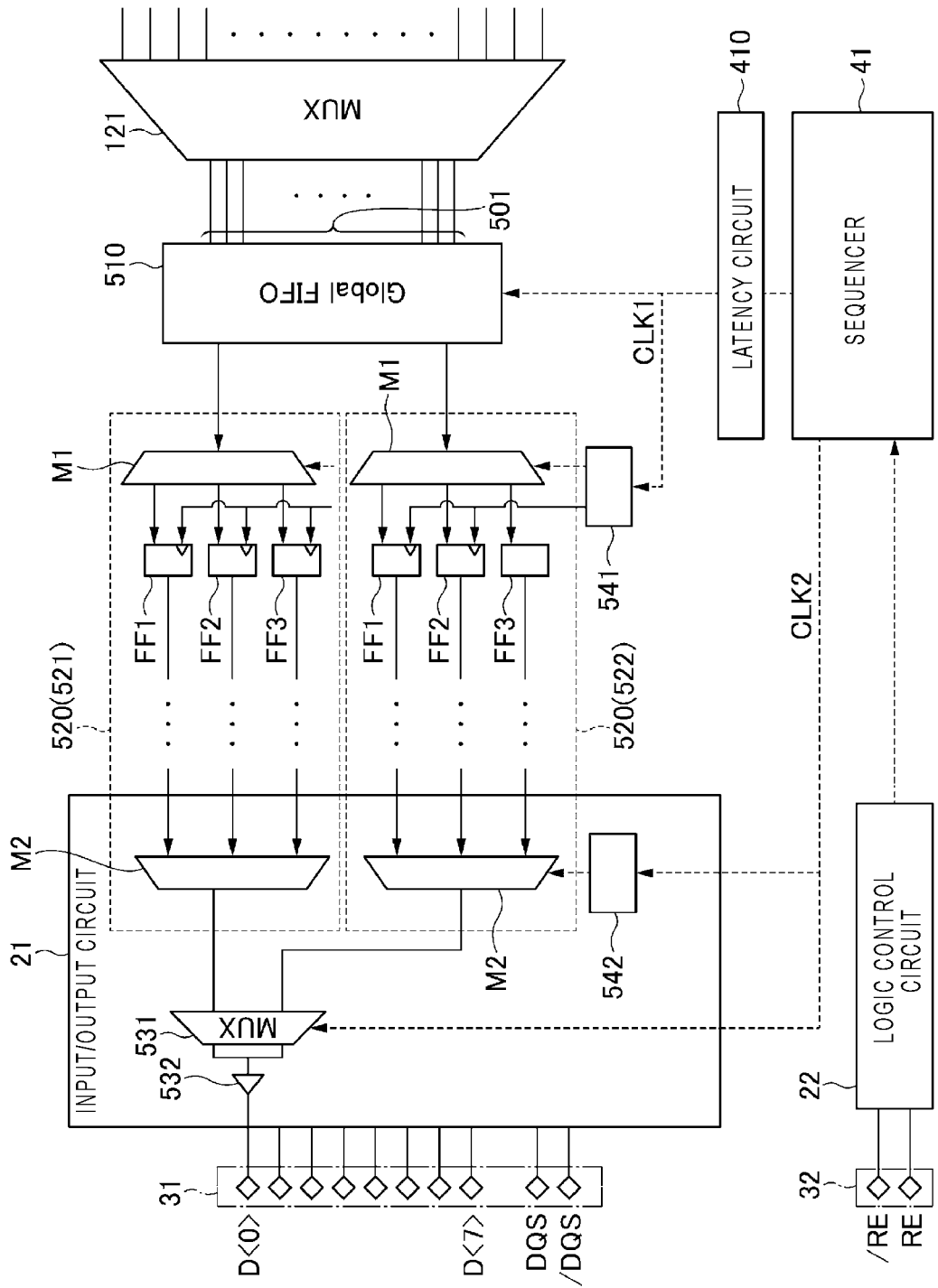
FIG. 21 is a diagram illustrating a configuration of a circuit for outputting data from a memory cell array to a memory controller in a memory system according to a modification.

In the embodiment, the second storing unit 520 is disposed in the input/output circuit 21. However, the configuration of the second storing unit 520 is not limited to this. The second storing unit 520 may be disposed to straddle the second data bus 502, for example, as in a modification illustrated in FIG. 21.

As in this modification, for example, the multiplexer M1 and the plurality of flip-flops FF of the second storing unit 520 may be arranged immediately after the first storing unit 510, and the multiplexer M2 of the second storing unit 520 may be disposed in the input/output circuit 21. In this case, the write pointer generation circuit 541 is disposed near the multiplexer M1 and the plurality of flip-flops FF, and the read pointer generation circuit 542 is disposed near the multiplexer M2.

In a case where the second storing unit 520 is disposed to straddle the second data bus 502, the number of wirings increases as compared with a case where the first storing unit 510 and the input/output circuit 21 are connected to each other by the second data bus 502. For example, assuming that the second data bus 502 includes 16 wirings, when the second storing unit 520 is disposed to straddle the second data bus 502 and when each of the second storing unit 522 corresponding to odd data and the second storing unit 521 corresponding to even data has three flip-flops FF, 48 wirings are required to interconnect the first storing unit 510 and the input/output circuit 21. However, increasing the number of wirings may slow down the switching speed of signals propagating through each wire. Thus, since it is not necessary to set the low threshold voltage of the transistor for transmitting and reception signals, the power consumption of the semiconductor memory device 2 associated with data transfer may be reduced.

Meanwhile, the write pointer generation circuit 541 may be disposed near the first storing unit 510. The clock signal CLK1 exhibiting high-speed transition is supplied to the write pointer generation circuit 541 and the first storing unit 510. Accordingly, since the write pointer generation circuit 541 and the first storing unit 510 may be disposed close to each other by locating the second storing unit 520 so as to straddle the second data bus 502, the control signal line for propagating the clock signal CLK1 may be shortened. Thus, the power consumption of the semiconductor memory device 2 associated with data transfer may be further reduced.

Further, in the embodiment, each of the first storing unit 510 and the second storing unit 520 has been described as including the plurality of flip-flops FF. However, the configuration of the first storing unit 510 and the second storing unit 520 is not limited to this. Each of the first storing unit 510 and the second storing unit 520 may be configured with a plurality of latch circuits instead of the plurality of flip-flops FF. By using a data storing circuit capable of storing data according to the write pointer Wptr, they may be configured to perform a so-called FIFO operation.

Figure 22:
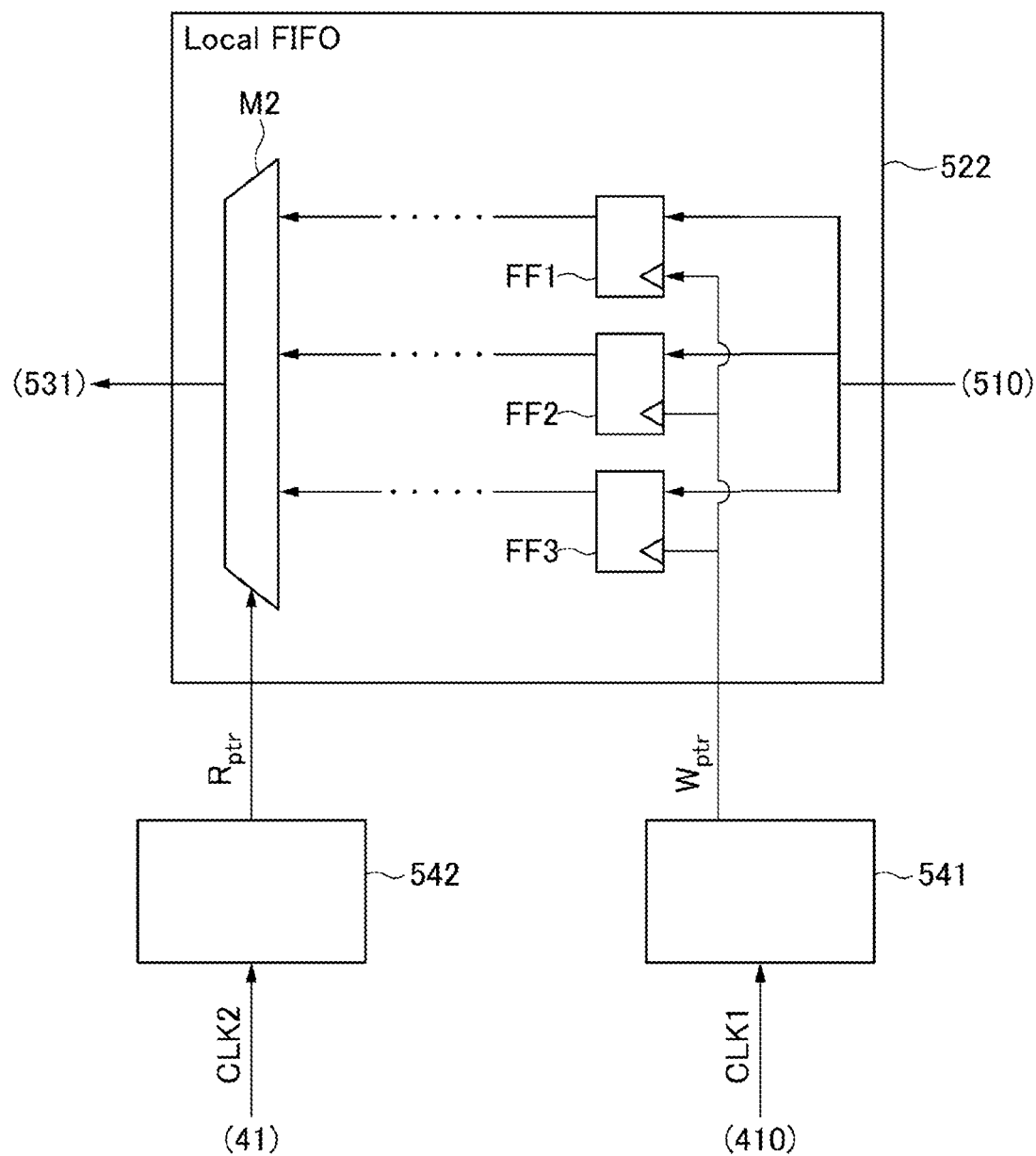
FIG. 22 is a diagram illustrating a configuration of a storing unit according to another configuration.

Further, in the embodiment, in the second storing unit 520, the multiplexer M1 selects one of the flip-flop circuits FF1, FF2, and FF3 based on the write pointer Wptr, and the selected one of the flip-flop circuits FF1, FF2, and FF3 stores the data based on the input clock signal CLK1. However, the configuration of the second storing unit 520 is not limited to this. For example, the write pointer Wptr may be directly supplied to the flip-flop circuits FF1, FF2, and FF3, and the flip-flop circuits FF1, FF2, and FF3 may store respective data sent from the first storing unit 510 based on the write pointer Wptr, as in another modification illustrated in FIG. 22. In this case, the multiplexer M1 may be omitted.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device comprising:
    a memory cell array;
    a storing unit configured to temporarily store a plurality of data read out from the memory cell array in a plurality of storage circuits;
    an output circuit configured to output data transmitted from the storing unit to an external memory controller;
    a control circuit configured to control the storing unit to sequentially output data to the output circuit in response to read timing control signals received from the memory controller and in accordance with a value of a read pointer, wherein
    the control circuit is configured to, in response to switching of the read timing control signals received from the memory controller:
        adjust the value of the read pointer, and
        control the storing unit to output data stored in one of the plurality of storage circuits corresponding to the value of the read pointer to the output circuit, and
    the control circuit is configured to, in response to a request for read data by the memory controller, set the value of the read pointer in accordance with a latency period during which data stored in the plurality of storage circuits are not overwritten, such that data stored in at least two of the plurality of storage circuits are output to the output circuit and transmitted from the output circuit to the memory controller as dummy data during the latency period, and are output to the output circuit and transmitted from the output circuit to the memory controller as the read data after the latency period.

2. The semiconductor memory device according to claim 1, wherein the value of the read pointer is incremented each time data is output from the storing unit to the output circuit, and the control circuit sets the value of the read pointer in response to the request for read data by the memory controller by decreasing the value thereof.

3. The semiconductor memory device according to claim 2, wherein an amount of the decrease in the value of the read pointer corresponds to the number of clock cycles of dummy data that are to be output from the storing unit to the output circuit.

4. The semiconductor memory device according to claim 1, further comprising:
a read pointer generation circuit configured to increment the value of the read pointer in accordance with a clock signal received from the control circuit.

5. The semiconductor memory device according to claim 4, wherein
the control circuit is configured to control the storing unit to store data in accordance with a value of a write pointer, and
the value of the write pointer is maintained to be the same during the latency period to prevent new data from being stored in the storing unit.

6. The semiconductor memory device according to claim 5, further comprising:
a write pointer generation circuit configured to update the value of the write pointer in accordance with a clock signal received from the control circuit, wherein
the clock signal for the write pointer generation circuit is not supplied to the write pointer generation circuit during the latency period.

7. The semiconductor memory device according to claim 6, further comprising:
a latency circuit configured to block the clock signal for the write pointer generation circuit from being supplied to the write pointer generation circuit for a predetermined number of clock cycles equal to the latency period.

8. A method of performing a read operation in a semiconductor memory device in response to a read command received from a memory controller, wherein the semiconductor memory device includes a memory cell array, a storing unit configured to temporarily store a plurality of data read out from the memory cell array in a plurality of storage circuits, and an output circuit configured to output data transmitted from the storing unit to the memory controller, said method comprising:
in response to a request for read data by the memory controller, setting a value of a read pointer in accordance with a latency period during which data stored in the plurality of storage circuits are not overwritten; and
in response to switching of read timing control signals received from the memory controller, adjusting the value of the read pointer, and outputting data stored in one of the plurality of storage circuits corresponding to the value of the read pointer to the output circuit, wherein
data stored in at least two of the plurality of storage circuits are output to the output circuit and transmitted from the output circuit to the memory controller as dummy data during the latency period, and thereafter are output to the output circuit and transmitted from the output circuit to the memory controller as the read data after the latency period.

9. The method according to claim 8, wherein
the value of the read pointer is incremented each time data is output from the storing unit to the output circuit.

10. The method according to claim 9, further comprising:
setting the value of the read pointer in response to the request for read data by the memory controller by decreasing the value thereof.

11. The method according to claim 10, wherein an amount of the decrease in the value of the read pointer corresponds to the number of clock cycles of dummy data that are to be output from the storing unit to the output circuit.

12. The method according to claim 8, further comprising:
incrementing the value of the read pointer in accordance with a clock signal during the latency period.

13. The method according to claim 12, further comprising:
storing data in the storing unit in accordance with a value of a write pointer, wherein
the value of the write pointer is maintained to be the same during the latency period to prevent new data from being stored in the storing unit.

14. The method according to claim 13, further comprising:
updating the value of the write pointer in accordance with a clock signal, except during the latency period.

15. The method according to claim 14, further comprising:
blocking the clock signal for updating the value of the write pointer from being supplied to a write pointer generation circuit that is configured to update the value of the write pointer in accordance with the clock signal for updating the value of the write pointer, for a predetermined number of clock cycles equal to the latency period.

* * * * *